United States Patent
Bhaskar et al.

(10) Patent No.: US 9,363,339 B2
(45) Date of Patent: Jun. 7, 2016

(54) STAGED DATA COMPRESSION, INCLUDING BLOCK LEVEL LONG RANGE COMPRESSION, FOR DATA STREAMS IN A COMMUNICATIONS SYSTEM

(71) Applicant: Hughes Network Systems, LLC, Germantown, MD (US)

(72) Inventors: Udaya Bhaskar, North Potomac, MD (US); Chi-Jiun Su, Rockville, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 205 days.

(21) Appl. No.: 14/214,736

(22) Filed: Mar. 15, 2014

(65) Prior Publication Data
US 2014/0223029 A1 Aug. 7, 2014

Related U.S. Application Data

(63) Continuation-in-part of application No. 13/180,969, filed on Jul. 12, 2011, now abandoned.

(60) Provisional application No. 61/787,288, filed on Mar. 15, 2013.

(51) Int. Cl.
| | |
|---|---|
| *G06F 7/00* | (2006.01) |
| *H04L 29/06* | (2006.01) |
| *H03M 7/30* | (2006.01) |
| *H03M 7/40* | (2006.01) |

(52) U.S. Cl.
CPC ............ *H04L 69/04* (2013.01); *H03M 7/3084* (2013.01); *H03M 7/3088* (2013.01); *H03M 7/4006* (2013.01)

(58) Field of Classification Search
None
See application file for complete search history.

(56) References Cited

U.S. PATENT DOCUMENTS

| | | | |
|---|---|---|---|
| 4,814,746 A | 3/1989 | Miller et al. | |
| 5,426,779 A | 6/1995 | Chambers | |
| 5,627,534 A | 5/1997 | Craft | |
| 6,624,762 B1 * | 9/2003 | End, III | ............... H03M 7/3088 341/51 |

(Continued)

OTHER PUBLICATIONS

Bar-Ness, Yeheskel et al., "String Dictionary Structure for Markov Arithmetic Encoding", IEEE International Conference on Communications, 1988, XP002672031, 1988.
ESR, "European Search Report", Jan. 16, 2013.
Williams, Ross, "LZRW3-A.C", XP002672032, http://www.ross.net/compression/download/original/old_lzrw3-a.c, Aug. 2, 1991, pp. 1-13.

(Continued)

*Primary Examiner* — David H Malzahn
(74) *Attorney, Agent, or Firm* — Potomac Technology Law, LLC

(57) ABSTRACT

Approaches for staged data compression are provided, where each stage reflects a progressive increase in granularity, resulting in a scalable approach that exhibits improved efficiency and compression performance. The first stage comprises a long-range block-level compressor that determines redundancies on a block-level basis (based on entire data blocks, as opposed to partial segments within data blocks). The second stage comprises a long-range byte-level compressor that compresses an uncompressed block based on byte segments within the block that match previously transmitted segments. The duplicate segments are replaced with pointers to matching segments within a decompressor cache. Non-matching segments of the data block are left uncompressed and passed to a third stage short-range compressor (e.g., a grammar-based compressor). The staged progression in granularity provides advantages of maximizing the compression gain while minimizing processing and storage requirements of the compressor and decompressor.

18 Claims, 11 Drawing Sheets

(56) References Cited

U.S. PATENT DOCUMENTS

| | | | |
|---|---|---|---|
| RE41,152 E | 2/2010 | Reynar et al. | |
| 7,840,744 B2 | 11/2010 | Bellows et al. | |
| 2009/0006510 A1 | 1/2009 | Laker et al. | |
| 2009/0060047 A1 | 3/2009 | Schneider | |
| 2013/0018932 A1* | 1/2013 | Bhaskar | H03M 7/3088 708/203 |
| 2014/0223029 A1* | 8/2014 | Bhaskar | H03M 7/3088 709/247 |

OTHER PUBLICATIONS

Williams, Ross, "Notes From the Comp. Compression FAQ", XP002672021, http://www.ross.net/compression/patents_notes_from_ccfaq.html, Mar. 21, 1996.

Yang, En-Hui et al., "Efficient Universal Lossless Data Compression Algorithms Based on a Greedy Sequential Grammar Transform—Part One: Without Context Models", IEEE Transactions on Information Theory, vol. 46, No. 3, May 1, 2000, XP011027647, May 1, 2000.

* cited by examiner

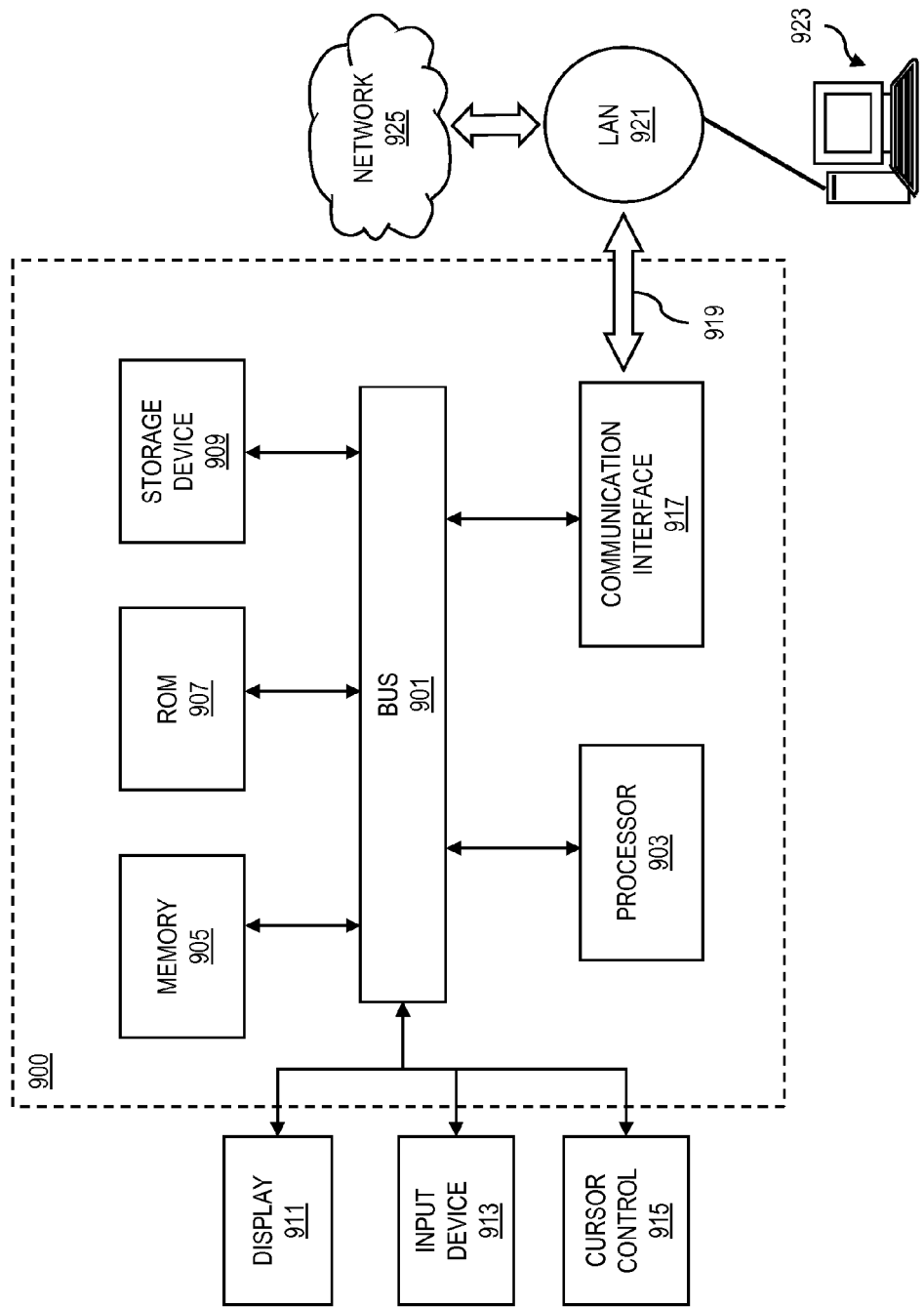

STAGED DATA COMPRESSION, INCLUDING BLOCK LEVEL LONG RANGE COMPRESSION, FOR DATA STREAMS IN A COMMUNICATIONS SYSTEM

RELATED APPLICATIONS

This application: (1) claims the benefit of the earlier filing date under 35 U.S.C. §119(e) of U.S. Provisional Application Ser. No. 61/787,288 (filed Mar. 15, 2013), and (2) is a Continuation-In-Part (CIP) of co-pending U.S. patent application Ser. No. 13/180,969 (filed Jul. 12, 2011, each of which is incorporated herein by reference in its entirety.

BACKGROUND

The present invention pertains to the field of data compression techniques, in particular, lossless data compression techniques for efficient transmission of internet traffic over data communications links such as, satellite, terrestrial wireless or wired links.

Analysis of internet traffic reveals that for certain content types, which constitute a significant portion of the total traffic, a high degree of redundancy exists in the transmitted data. This manifests itself in the form of macro redundancies and micro redundancies. Macro redundancies are basically duplications of long byte strings, which occur when the same or similar data entities, (typically comprising hundreds of bytes or more) are repeatedly transmitted on a link between two end points. Micro redundancies occur due to the fine grain syntax underlying the byte sequences, which imposes a structure so that some smaller byte patterns (typically a few bytes in length) occur more frequently than others. Both of these types of redundancies must be fully exploited by lossless data compression techniques to transmit the data most efficiently. The benefit is conservation of communication link resources (such as channel bandwidth and power) as well as improvement in user experience due to lower latency and faster response time.

Redundancies in the data stream can appear at many levels. At the highest level, an entire web page or a document, which was previously transmitted may be retransmitted on the data stream (for example, due to user repeating the request for such an entity); at a lower level, an object within a web page (such as an image belonging to an advertisement in a web page) may be frequently retransmitted, because it is common across multiple popular web pages; or at the lowest level, a byte segment which was previously transmitted may reappear on the data stream. Each of these redundancies can be exploited by preventing the retransmission of the duplicate data, provided appropriate memory and processing techniques are employed at both ends of the connection. Further, the range (e.g., the separation in terms of the number of transmitted bytes from an occurrence of a byte segment to its redundant occurrence), over which redundancies occur in the data stream, can span from a few bytes to several tens or hundreds of megabytes. It is dependent on several factors such as the type of content, speed of the link, usage pattern of the user, the number of users attached to the end point etc. Moreover, the redundancies can be micro redundancies, where the duplications are only a few bytes long or much longer macro redundancies.

Lossless data compression is a powerful technique that compresses data streams for transmission over communications links by reducing data redundancies within the data streams, facilitating improved efficiency and utilization of link capacity. Lossless data compression algorithms exploit statistical redundancy to represent data more concisely, without losing information. A compressor is used to compress packets at one end of the link; at the other end of the link, a de-compressor losslessly recovers the original packets. There exists a class of data compression techniques referred to as long-range data compression. Long-range data compression refers to compression techniques that compress data based on a relatively large data dictionary reflecting one or more data streams over a corresponding historical length of time (e.g., the length of time being proportional to the size of the dictionary—the larger the dictionary, the larger the storage capacity to cover longer periods of historical data). Some of the common current techniques for long-range data compression belong to the Lempel-Ziv family of compressors (LZ77 and LZ78, and derivatives thereof, such as gzip, compress, or V.44). Another class of data compression techniques exists, which are referred to as short-range data compression techniques. Rather than relying on a large dictionary (a long historical view of the data stream), short-range data compression techniques operate on small data sets, such as grammar-based algorithms, such as Yang-Kieffer (YK) universal data compression (see, e.g., U.S. Pat. Nos. 6,400,289 and 6,492,917). For example, grammar-based algorithms construct context-free grammar deriving from a single string, and also may apply statistical predictions referred to as arithmetic coding.

Current long-range data compression techniques, however, suffer from significant disadvantages. For example, such techniques require a dictionary or cache at both the compression and decompression ends, where (as explained in further detail below) the cache at the decompression end is required to be at least the same size (or larger) as the cache at the compression end. Further, in a system where a communications hub supports a multitude of end-user communications terminals (e.g., a satellite hub supporting a multitude of end-user satellite terminals, potentially amounting to tens of thousands of terminals per hub), the hub is required to maintain a compression cache for each end-user terminal. Such existing long-range data compression techniques thus suffer from scalability issues. For example, one aspect of such techniques is that the compression performance increases with increases in the size of the respective compression and decompression caches. Accordingly, in order to increase the size of the decompression caches within an end-user terminal, the respective compression caches corresponding to each end-user terminal must similarly be increased in the hub. It follows that, for example, in a case where a hub supports 10,000 terminals and the compression is applied at the hub side (on the outroute transmissions), a 1 GB increase in the cache sizes of each terminal manifests itself in a requirement for a 1 GB increase in each respective compressor cache in the hub—amounting to a total memory increase of 10,000 GB within the hub (1 GB for each compression cache for each terminal).

What is needed, therefore, is a resource efficient scalable approach for high compression gain lossless long-range compression of data traffic (e.g., Internet traffic), in systems where a communications hub supports a multitude of communications terminals.

SOME EXAMPLE EMBODIMENTS

These and other needs are addressed by aspects and embodiments of the present invention, whereby resource efficient scalable approaches for high compression gain lossless long-range compression of data traffic (e.g., Internet traffic), in systems where a communications hub supports a multitude of communications terminals.

In accordance with example embodiments of the present invention, methods for staged data compression comprises receiving, by a long-range block-level compressor of a device, a plurality of data blocks of an input data stream, determining a hash value corresponding to each data block, storing the determined hash values in a block hash table, and determining whether the hash value for each data block matches any of the hash values stored in the block hash table, wherein each hash value stored in the table corresponds to a respective previously received one of the data blocks of the input stream. When it is determined that the hash value for a one data block of the input data stream matches a one of the hash values stored in the block hash table, the methods further comprise generating a block-level match descriptor, and removing the one data block from the input data stream. When it is determined that the hash value for a further data block of the input data stream does not match any of the plurality of hash values stored in the block hash table, the method further comprises (i) outputting the further data block, (ii) receiving, by a long-range byte-level compressor of the device, the further data block, and performing a long-range byte-level compression function on the further data block, which includes determining one or more bit strings of the further data block that each matches a respective bit string of a previously received data block, generating a byte-level match descriptor for each such bit string of the further data block, replacing each such bit string of the further data block with the respective byte-level match descriptor, and outputting literal byte segments reflecting any uncompressed literal segments of the further data block, and (iii) receiving, by a short-range compressor of the device, the uncompressed literal segments of the further data block, performing a short-range compression function on the literal segments, and generating resulting compressor codes. The methods further comprise multiplexing the block-level match descriptor, the byte-level match descriptors and the compressor codes.

According to further embodiments, the methods may further comprise determining, with respect to each new data block of the input data stream, one or more older data blocks of the input data stream that will be overwritten by the new data block within a decompressor data cache, and marking as stale the hash values within the block hash table corresponding to the data blocks that will be overwritten. By way of example, each determined hash value is stored in the block hash table along with metadata providing a storage location within the decompressor data cache where the corresponding data block is stored and providing a pointer to the oldest data block within the decompressor data cache. Wherein the determination of the one or more older data blocks that will be overwritten comprises assessing the block hash table, based on the metadata, starting with the oldest hash value and continuing until reaching a hash value corresponding to a first data block that will not be overwritten in the decompressor data cache.

According to additional embodiments of the methods, the long-range byte-level compression function further includes, for each bit string of the further data block that matches a respective bit string of a previously received data block, determining whether the bit string has been output as or within a one of the previous literal byte segments, and, when it is determined that the bit string has been output as or within a one of the previous literal byte segments, skipping the byte-level compression of the bit string and outputting the bit string as a literal byte segment for compression via the short-range compression function. By way of example, the determination of whether the bit string has been output as or within a one of the previous literal byte segments includes maintaining a list of descriptors respectively corresponding to previously output literal byte segments and determining whether the bit string is contained in the list of descriptors.

According to further embodiments of the methods, the determination of the one or more bit strings of the further data block that each matches a respective bit string of a previously received data block comprises generating a fingerprint corresponding to each of the one or more bit strings of the further data block based on a sliding fingerprint window, and storing the finger prints in a byte hash table, determining whether the fingerprint for each of one or more of the bit strings of the further data block matches any of the fingerprints stored in the byte has table, wherein each fingerprint stored in the table corresponds to a respective bit string of the previously received data blocks, and when it is determined that the fingerprint for a one of the bit strings of the further data block matches a one of the fingerprints stored in the byte hash table, determining whether the one bit string matches the bit string corresponding to the matched fingerprint in the byte hash table, wherein the bit strings of the previously received data blocks are stored in a compressor byte cache. By way of example, when it is determined that the fingerprint for a one of the bit strings of the further data block matches a one of the fingerprints stored in the byte hash table, the determination of the one or more bit strings of the further data block that each matches a respective bit string of a previously received data block further comprises expanding the match determination by determining bit strings to the left and to the right of the one bit string of the further data block that match respective bit strings to the left and to the right of the bit string stored in the compressor byte cache that matches the one bit string of the further data block.

In accordance with example embodiments of the present invention, an apparatus for staged data compression comprises a long-range block-level compressor configured to receive a plurality of data blocks of an input data stream, to determine a hash value corresponding to each data block, to store the determined hash values in a block hash table within a memory of the apparatus, and to determine whether the hash value for each data block matches any of the hash values stored in the block hash table, wherein each hash value stored in the table corresponds to a respective previously received one of the data blocks of the input stream. Further, when it is determined that the hash value for a one data block of the input data stream matches a one of the hash values stored in the block hash table, the long-range block-level compressor is further configured to generate a block-level match descriptor and to remove the one data block from the input data stream, and, when it is determined that the hash value for a further data block of the input data stream does not match any of the plurality of hash values stored in the block hash table, the long-range block-level compressor is further configured to output the further data block. The apparatus further comprises a long-range byte-level compressor configured to receive the further data block and to perform a long-range byte-level compression function on the further data block, wherein the long-range byte-level compression function includes determining one or more bit strings of the further data block that each matches a respective bit string of a previously received data block, generating a byte-level match descriptor for each such bit string of the further data block, replacing each such bit string of the further data block with the respective byte-level match descriptor, and outputting literal byte segments reflecting any uncompressed literal segments of the further data block. The apparatus further comprises a short-range compressor configured to receive the uncompressed literal segments of the further data block, to perform a short-range compression function on the literal segments, and to generate resulting compressor codes. The apparatus further comprises a multiplexer configured to multiplex the block-level match descriptor, the byte-level match descriptors and the compressor codes.

According to further embodiments, the long-range block-level compressor is further configured to determine, with respect to each new data block of the input data stream, one or more older data blocks of the input data stream that will be overwritten by the new data block within a decompressor data cache, and to mark as stale the hash values within the block hash table corresponding to the data blocks that will be overwritten. By way of example, each determined hash value is stored in the block hash table along with metadata providing a storage location within the decompressor data cache where the corresponding data block is stored and providing a pointer to the oldest data block within the decompressor data cache, and the determination of the one or more older data blocks that will be overwritten comprises assessing the block hash table, based on the metadata, starting with the oldest hash value and continuing until reaching a hash value corresponding to a first data block that will not be overwritten in the decompressor data cache.

According to additional embodiments of the apparatus, the long-range byte-level compression function further includes, for each bit string of the further data block that matches a respective bit string of a previously received data block, determining whether the bit string has been output as or within a one of the previous literal byte segments, and, when it is determined that the bit string has been output as or within a one of the previous literal byte segments, skipping the byte-level compression of the bit string and outputting the bit string as a literal byte segment for compression via the short-range compression function. By way of example, the determination of whether the bit string has been output as or within a one of the previous literal byte segments includes maintaining a list of descriptors respectively corresponding to previously output literal byte segments and determining whether the bit string is contained in the list of descriptors.

According to further embodiments of the apparatus, the determination of the one or more bit strings of the further data block that each matches a respective bit string of a previously received data block comprises generating a fingerprint corresponding to each of the one or more bit strings of the further data block based on a sliding fingerprint window, and storing the finger prints in a byte hash table, determining whether the fingerprint for each of one or more of the bit strings of the further data block matches any of the fingerprints stored in the byte has table, wherein each fingerprint stored in the table corresponds to a respective bit string of the previously received data blocks, and when it is determined that the fingerprint for a one of the bit strings of the further data block matches a one of the fingerprints stored in the byte hash table, determining whether the one bit string matches the bit string corresponding to the matched fingerprint in the byte hash table, wherein the bit strings of the previously received data blocks are stored in a compressor byte cache. By way of example, when it is determined that the fingerprint for a one of the bit strings of the further data block matches a one of the fingerprints stored in the byte hash table, the determination of the one or more bit strings of the further data block that each matches a respective bit string of a previously received data block further comprises expanding the match determination by determining bit strings to the left and to the right of the one bit string of the further data block that match respective bit strings to the left and to the right of the bit string stored in the compressor byte cache that matches the one bit string of the further data block.

Still other aspects, features, and advantages of the present invention are readily apparent from the following detailed description, based on the figures and description illustrating and describing a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF SUMMARY OF THE DRAWINGS

Embodiments of the present invention are illustrated by way of example, and not by way of limitation, in the accompanying figures, in which like reference numerals refer to similar elements, and in which:

FIG. 9 illustrates a block diagram of a computer system that can be utilized in implementing example embodiments of the present invention.

DETAILED DESCRIPTION

Figure 1:
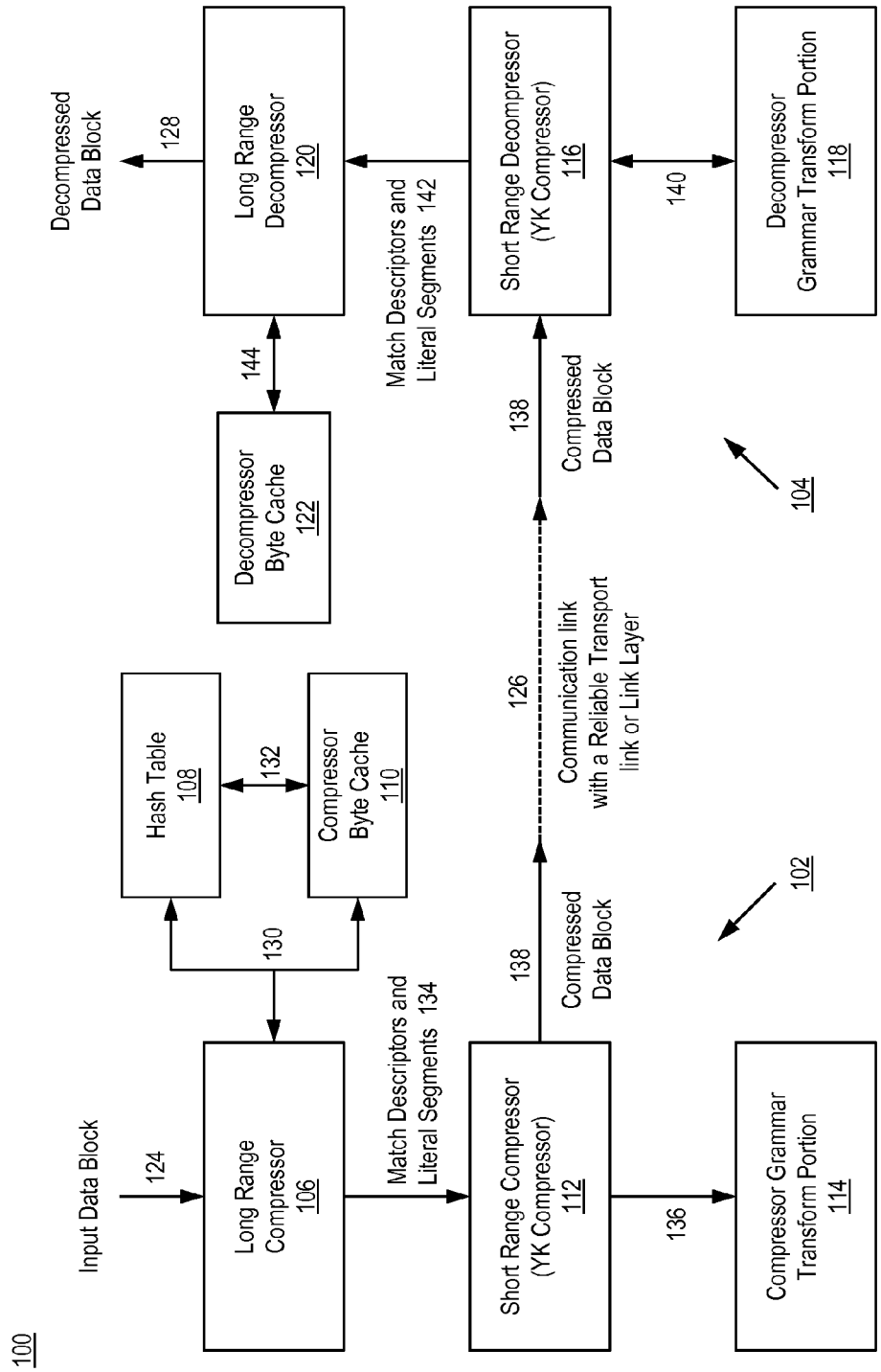
FIG. 1 illustrates a communication system in accordance with an aspect of the present invention.

Systems and methods for lossless compression of data traffic (e.g., Internet traffic), comprising resource efficient scalable approaches for high compression gain lossless long-range compression of data traffic (e.g., Internet traffic), in systems where a communications hub supports a multitude of communications terminals, are herein described.

According to aspects and embodiments of the present invention, a novel lossless data compression approach, applicable to efficient transmission of data traffic over data communication links or channels such as satellite, terrestrial wireless or wireline links is provided. Certain types of internet traffic exhibit a significant degree of redundancy and can be compressed accordingly. Lossless data compression techniques reduce or eliminate these redundancies, thereby reducing the amount of traffic carried over the communications channel. This leads to improvement in the utilization of communication channel resources (such as channel bandwidth and power) as well as improvement in end user experience due to reduced latency and faster application response time.

Long range compression (LRC) is a powerful lossless data compression technique for reducing the amount of data transported over a link, so that the link capacity can be utilized more efficiently. Packets entering the link are processed by an LRC compressor, resulting in "compressed" packets of smaller size. At the other end of the link, the compressed packets are processed by an LRC de-compressor to losslessly recover the original packets. Compression is generally achieved by detection of duplicate data segments within a byte cache and highly efficient encoding of such duplicate segments. A long range compressor retains a "long range" of previously received bytes in an input byte stream for compression and captures macro redundancies in the input byte stream. As such a current byte of data may be compared with all of the stored bytes for any similar bit sequences (redundancies). A main role of long-range data compression is to provide the compressor access to a large history of past transmitted data (e.g., a large memory buffer of several tens or hundreds of megabytes), while minimizing the processing complexity needed to process the large amount of stored data. Further, the performance of such compression techniques improves with the size of the byte cache, which is stored in memory. As a result, the size and the optimum use of the available memory resources in the devices that implement compression and decompression is a critical factor in determining compression efficiency. A primary advantage of such long-range data compression is that macro redundancies as seen within a long history of the input data stream can be captured with very modest processing resources.

According to example embodiments of the present invention, an architecture is provided, consisting of three sequential compression stages, where each stage reflects a progressive increase in granularity, resulting in a scalable approach that exhibits improved efficiency and compression performance. By way of example, the first stage determines redundancies on an input block-level basis (based on entire input blocks of data, as opposed to partial matching based on segments within input blocks of data). Where an entire input block comprises a duplicate of a previously transmitted block, a block-level compressor compresses the input block as a whole. Otherwise, where the entire input block does not comprise a duplicate of a previous block, the input block is passed to a second stage long-range compressor, which compresses the block based on byte segments within the block that match previously transmitted and cached data. At the second stage, the duplicate segments are replaced with pointers to segments cached within the decompressor cache, and nonmatching segments (literal segments) are left uncompressed. By way of example, the segment size (e.g., granularity of the second stage) may be several tens of bytes or larger, chosen to achieve an optimal trade-off between computation efficiency and compression efficiency. The uncompressed literal segments are then passed on to a third stage compressor (e.g., a short-range compressor), which operates at the granularity of individual bytes. Such a progression from the largest granularity of an entire block to the lowest granularity of an individual byte provides the advantage of maximizing the compression gain while minimizing the processing and storage requirements of the compressor and decompressor.

By way of example, the first stage compressor comprises a block-level long-range data compressor, which compresses with reference to a potentially large sized block cache. The first stage compresses entire input data blocks that are duplicated within the depth of the block cache. The input data "block" comprises a byte sequence that is provided to each compressor instantiation from a higher layer, where the block size depends on that higher layer—for example, depending on the higher layer, the block may correspond to an entire HTTP body object or a segment of an HTTP body object. The size of the block, however, does not affect the architecture or algorithm of the first stage compressor. The efficiency and scalability of the first stage block compressor is facilitated by an approach whereby the cache of the block compressor does not store copies of the entire blocks being compressed, but rather operates based on a collision resistant hash function applied to the input blocks. Further, block matches are detected by determining matches between the hash of the current input block and stored hashes of the previous input blocks. Accordingly, by limiting the storage requirement on the compressor side, a less expensive and more scalable implementation can be achieved.

Moreover, in accordance with aspects of the invention, "stale hashes" can be detected and thus matches against them can be prevented. Stale hashes are determined by keeping track of the decompressor block cache. At the decompressor, old blocks get overwritten as newly decompressed blocks are added to the circular decompressor block cache, and by keeping track of the overwritten blocks in the decompressor cache, the compressor can determine the hashes within the compressor cache that are "stale" (e.g., hashes that correspond with such overwritten blocks can be marked as stale to inhibit determining matches against them). Further, the compressor may save the hashes in a bucketed hash table in order to conserve the storage space required to store the hashes.

By way of further example, where an entire input data block as a whole could not be compressed by the first stage (e.g., where a match was not found within the block cache), the input data block is passed to the second stage, comprising a sub-block-level (segment-level) long-range compressor. In accordance with such a second stage, the data block is compressed by finding sub-block or data segment duplications with reference to a compressor "byte cache" of previous data (e.g., tens or hundreds of megabytes long). Unlike the block cache of the first stage, a copy of the compressor byte cache must be maintained by the decompressor. The maintenance of duplicate caches is required to achieve a computation efficient detection of duplicated segments within the block. The second stage thereby captures finer grain duplications that are smaller than an entire block, but are still several 10's, 100's or even 1000's of bytes long. An advantage of the second stage is that sub-block-level redundancies, as seen within a long history of the byte stream, can be captured with a relatively modest level of computation.

As the third stage of this example, any parts of the data block that could not be compressed by the first and second stages are finally processed by the third stage comprising a short-range data compressor. For example, the third stage compressor may comprise a grammar-based compressor (GBC), which typically uses sophisticated grammar transform and adaptive arithmetic coding. The main role of the third stage is to exploit any residual or micro redundancies in the literal segments passed on by the second stage, by applying more powerful compression techniques as compared to the first and second stages. Since the first two stages have already eliminated long range redundancies, the short range compressor can operate with a smaller history (e.g., less data to be processed), with no loss in performance. This permits the use of more powerful techniques than those of the first two stage, delivering near optimal compression gain. Further, since the first two stages have eliminated large grain redundancies, any remaining fine grain redundancies (e.g., at the level of a few bytes) can be exploited by the third stage to further compress the data stream(s). The performance of the third stage compressor is largely based on the grammar transform and adaptive arithmetic coder. Accordingly, the elimination of the higher granularity redundancies by the computationally simpler first and second stages facilitates the more sophisticated short-range third stage compression for capturing more complex structural micro redundancies, achieving near optimal compression gains with a minimize level of complexity with respect to the overall approach.

Overall, therefore, the presence of the block-level long-range compression stage as the first compression stage results in reduced processing complexity as compared to using either the short range compressor by itself or the sub-block-level long range compression stage with the short range compression stage. In the case of Internet traffic, for example, this translates to a lower web page load time as seen by the user, which is a critical metric in web browsing applications. Further, with such a staged approach, the design parameters of the three compression stages can be jointly optimized, resulting in an optimal trade-off between the overall compression gain and the resources needed for the implementation of the compression stages, (e.g., the memory capacity and the processing power on both the server and the client ends of the network connection). In other words, the compression gain is maximized while maintaining complexity and resource requirements at comparatively reasonable levels. Moreover, the three stage architecture of such example embodiments can easily be reduced to a two stage architecture by eliminating the third short-range compressor stage.

In accordance with example embodiments of the present invention, the first stage block-level long-range compression approaches are described below in further detail with reference to FIGS. 6A, 6B, 7A, 7B, and the second stage byte-level long-range compression and short-range compression (e.g., grammar-based compression) approaches are described below in further detail with reference to FIGS. 1-5.

In a non-streaming mode compression scheme, compression is based only on the current input block of data and after the current block has been compressed, and the compressor state is reinitialized (e.g., history buffer is cleared). In the non-streaming mode compression scheme, only redundancy within an input block can be compressed. As such, the history of previous blocks cannot be used for compressing future blocks. Consider for example the non-streaming mode compression scheme of conventional file compressors. With conventional file compressors, if two identical files are input into the compressor, one after another, the history of the first file will have already been forgotten when the second file is input. As a result, the overall compressed size is 2× the compressed size of one file. If the conventional file compressor is used in a streaming mode, the overall compressed size will be the compressed size of one file plus a small number of bytes.

In a streaming mode compression scheme, in accordance with aspects of the present invention, compression is based on not only on the redundancy within the current input block in process but also on the redundancy of the blocks that have been processed in the past. The compressor history is dynamic and "live," wherein only the size of the allocated history buffer limits how many blocks the compressor can remember (can make use of). Due to its dynamic memory about the past, a streaming mode compression scheme in accordance with aspects of the present invention provides significantly better compression gain than a non-streaming mode compression scheme. The extent of gain depends on the number of redundancies present in the data and the size of the allocated history buffer. In particular, if most of the redundancies exist among a long range of input blocks, streaming mode compression scheme in accordance with aspects of the present invention will provide a far more efficient compression than that of the non-streaming mode compression scheme.

In an example embodiment, a system is provided for use with streaming blocks of data, wherein each of the streaming blocks of data includes a number of bits of data. The system includes a first compressor and a second compressor. The first compressor receives and stores a first portion of the streaming blocks. For purposes of discussion, presume that the first compressor receives and stores a number n blocks of the streaming blocks of data. Then, the first compressor receives and stores a block of data to be compressed. The compressor is operable to compress consecutive bits within the block of data to be compressed based on the n blocks of the streaming blocks of data. The first compressor outputs a match descriptor and a literal segment. A match descriptor is based on the compressed consecutive bits. For example, for purposes of discussion, presume that only a portion of the block of data (string of consecutive bits) to be compressed is the same as a portion (string of consecutive bits) of the first received block—the first block of the previous n blocks of the streaming blocks of data. In this case, a match descriptor may be used to identify or point to the location of the similar portion (the location of the string of consecutive bits) in the first block of the previous n blocks of the streaming blocks of data. By providing merely a match descriptor, as opposed to the portion of the block that is similar to the first block (the actual string of consecutive bits), the overall data size is decreased. The literal segment is based on a remainder of the number of bits of the data to be compressed not including the consecutive bits. For example, as discussed above, presume that only a portion of the block of data (string of consecutive bits) to be compressed is the same as a portion (string of consecutive bits) of the first received block—the first block of the previous n blocks of the streaming blocks of data. The remainder of the block of data to be compressed that is not the same as a portion of any of the first n received blocks are provided as a literal segment. These bits of data are "literally" the same bits of data that are input into the system.

In an example embodiment a fingerprint hash computation portion and a cache are additionally included. In this example embodiment, the first compressor additionally includes a fingerprint computation portion, a fingerprint matching portion and an output block forming portion. The fingerprint computation portion establishes a first window in a first received block of the streaming blocks of data. The block may be in any one of the number n blocks of the streaming blocks of data. For purposes of discussion, presume that the fingerprint computation portion establishes a window of bits of data in the first block of data of the n blocks of the streaming blocks of data. The fingerprint computation portion computes a first fingerprint based on a plurality of bits of data within the first window. A fingerprint of a data window is a string of bits that is much smaller in size than the original data in the window. Because of the much smaller size, much less processing resources are required to compare fingerprints than comparing the original data in the windows. For example, when trying to match one 210-byte data window with 31 other 210-byte data windows, a large amount of processing resources may be needed. However, if fingerprints are used, wherein for example a fingerprint may be a 25-bit entity, much less processing resources may only be required to match one 25-bit data entity with the 31 other 25-bit data entities. Once a fingerprint is computed, the fingerprint computation portion then establishes a second window of the block of data to be compressed and to compute a second fingerprint based on a plurality of bits of data within the second window. The computed fingerprints for each block are stored in a hash table and are reused for detecting possible matches in future blocks. The cache stores a first window literal segment of bits corresponding to the first window. The fingerprint hash computation portion then creates a first hash index based on the first fingerprint and creates a second hash index based on the second fingerprint.

A hash function is any well-defined procedure or mathematical function that converts a large, possibly variable-sized amount of data into a small datum, usually a single integer that may serve as an index to an array (cf. associative array). In accordance with aspects of the present invention, the values returned by a hash function are indices to a fingerprint hash table, which stores each fingerprint and its associated metadata (e.g., the location in the cache of the window from which the fingerprint was computed). Hash functions are primarily used in hash tables, to quickly locate a data record given its search key. Specifically, accordance with aspects of the present invention, the search key is a fingerprint, and the hash function is used to map the search key, e.g., fingerprint, to the hash index. The index gives the place where the corresponding record should be stored. The number of possible indices is much smaller than the number of possible fingerprints. Accordingly, hash functions reduce the amount of storage area required to save fingerprints.

The fingerprint matching portion detects if a newly computed fingerprint has a match against any previously computed fingerprint (corresponding to data in the cache). This is based on the hash index of the new fingerprint. The fingerprint stored at that index of the hash table is compared to the new fingerprint. If these two fingerprints are identical, a fingerprint match has occurred. This indicates that an identical window of bits exists somewhere in the cache. The location of this identical window is provided by the metadata. When a newly computed fingerprint is found to match a previous fingerprint for the data in the cache, the match region is expanded to the maximum possible width.

The second compressor is arranged to receive and store the match descriptor and the literal segment from the first compressor. The second compressor operates only on the literal segment and does not modify the match descriptor. The second compressor may use its own history, dictionary, grammar or any other form of internal memory of previously input literals to compress the current literal segment. Any known compression technique may be used. Finally, the second compressor outputs a compressed data block including the match descriptor, as passed directly from the first compressor, and a compressed string of data based on the compressed literal segment.

In an example embodiment, the second compressor includes a parsing portion, a grammar transform portion and an adaptive arithmetic coding portion. The parsing portion successively parses the literal segment into the longest prefixes which matches symbols in a grammar. The grammar is updated after each parsing. Each parsed symbol and information pertaining to the grammar update are passed to the adaptive arithmetic coder. The adaptive arithmetic coding portion performs entropy encoding to represent the parsed symbol and the grammar update to produce compression of the literal segment, wherein entropy encoding is a lossless data compression scheme that is independent of the specific characteristics of the medium. The compressed block output from the second compressor includes the match descriptor and the compressed literal segment.

FIG. 1 illustrates a communication system 100 in accordance with an aspect of the present invention. As illustrated in FIG. 1, communication system 100 includes a compression side 102 and a decompression side 104. Compression side 102 transmits to decompression side 104 via a communication link 126 having a reliable transport or link layer. Compression side 102 includes a long range compressor 106, a hash table 108, a compressor byte cache 110, a short range compressor 112 and a compressor grammar transform portion 114. In this example embodiment, long range compressor 106, hash table 108, compressor byte cache 110, short range compressor 112 and compressor grammar transform portion 114 are illustrated as individual devices. However, in some embodiments of the present invention, at least two of long range compressor 106, hash table 108, compressor byte cache 110, short range compressor 112 and compressor grammar transform portion 114 may be combined as a unitary device.

Decompression side 104 includes a short range de-compressor 116, a de-compressor grammar transform portion 118, a long range de-compressor 120 and a de-compressor byte cache 122. In this example embodiment, short range de-compressor 116, de-compressor grammar transform portion 118, long range de-compressor 120 and de-compressor byte cache 122 are illustrated as individual devices. However, in some embodiments of the present invention, at least two of short range de-compressor 116, de-compressor grammar transform portion 118, long range de-compressor 120 and de-compressor byte cache 122 may be combined as a unitary device.

Long range compressor 106 is arranged to receive a stream of data blocks, an example block of a stream is indicated as an input data block 124. Input data block 124 varies in length, ranging from a few bytes to thousands of bytes, at a time. Some non-limiting examples of input data block 124 are IP blocks or web objects or any other blocks of data, which may be communicated over communication link 126. Long range compressor 106, hash table 108 and compressor byte cache 110 communicate with each other via a signal 130. Hash table 108 receives fingerprints computed by long range compressor 106. A hash function is used to map the fingerprint to its associated hash index. The hash index serves as an index to hash table 108, where the fingerprint and the metadata associated with that fingerprint value is stored. Hash table 108 may be implemented using any known data structure. Compressor byte cache 110 stores the previously received data blocks within the stream of data blocks, which is checked against input data block 124 for redundancy. The fingerprint metadata stored by the hash table 108 corresponds to the location of the fingerprint data window in compressor byte cache 110. Hash table 108 and compressor byte cache 110 communicate with each other via signal 132. Compressor byte cache 110 is implemented as a contiguous circular byte buffer scheme, in accordance with an aspect of the invention, with wrap-around occurring only at block boundaries. The detail implementation of compressor byte cache 110 will be described later.

For the purposes of discussion, presume that input data block 124 contains a segment of bytes, which had occurred in at least one previously received data block of the stream of data blocks. Long range compressor 106, hash table 108 and compressor byte cache 110 work together to look for duplication of a segment of data (not necessarily the whole block), which had occurred earlier. Long range compressor 106 extracts characteristic patterns of data, also called fingerprints, from input data block 124. A hash value is computed for each fingerprint. The computed hash value serves as an index to hash table 108, where the fingerprint and all the metadata associated with that fingerprint is stored. The metadata of a fingerprint is basically a location index to the compressor byte cache 110; it points to the location of the data (within compressor byte cache 110) from which the fingerprint had been computed. Metadata is used to map a fingerprint back to a byte sequence within compressor byte cache 110. Fingerprints are computed for each byte of incoming input data block 124. Based on a fingerprint selection process, most of the fingerprints are discarded and only few are stored. In one embodiment, fingerprints that have 'zero' in their last six least significant bits (LSB) are selected to be stored.

At a later time, if a fingerprint of input data block 124 matches with a fingerprint that is stored in hash table 108, it indicates that bytes of data of a previously received data block match bytes of data of input data block 124. In one embodiment, a fingerprint is computed over window size of data of 64 bytes. There could be a match of more than 64 bytes of data so the match region may be expanded to the left (less recently received bytes) and to the right (more recently received bytes). This will be described in greater detail below. Typically there could be thousands of matching bytes between a current data block and previous data blocks, contributing to long range compression. A valid match indicates that a segment of bytes in input data block 124 match with a segment of bytes stored in compressor byte cache 110. Once a valid match is found, long range compression of that segment of input data block 124 may be performed.

Long range compressor 106 encodes the matched segment as a match descriptor, which contains the information about the location of the matched segment of bytes within input data block 124 and length of the matched segment. The unmatched byte segments, called literal segments, are not compressed. Long range compressor 106 provides match descriptors and literal segments to short range compressor 112 via a signal line 134.

Short range compressor 112 is operable to compress short range duplications in input data block 124, where some byte patterns occur more frequently than others. In a non-limiting example embodiment, a grammar-based compressor is illustrated but any short range compression method may be used for second stage compression. Short range compressor 112 receives blocks that may include multiple match descriptors and literal segments via signal 134. In one embodiment, short range compressor 112 is a more compact and structured form of dictionary based compressors. Dictionary based compressors look for patterns in the byte segments and are based on the assumption that certain phrases occur more often than others. By way of example, short range compressor 112 communicates with compressor grammar transform portion 114 via a signal 136. The literal segment is parsed into a sequence of symbols in grammar transform portion 114. Grammar within grammar transform portion 114 is updated after each parsing.

Overall, the compression processing applied to input data block 124 is determined adaptively. A given segment of input data block 124, depending on (i) the contents of compressor byte cache 110 of long range compressor 106, (ii) the grammar state of short range compressor 112 and (iii) the length of the byte segment, may be processed by long range compressor 106 followed by short range compressor 112 or it may bypass long range compressor 106 and be directly compressed by short range compressor 112. This is motivated by the observation that when compressor grammar transform portion 114 contains the variables that can compactly represent the given segment of input data block 124, short range compressor 112 is far more efficient than long range compressor 106.

Hence, whenever this condition is satisfied, it is beneficial to directly compress the given segment of input data block 124 using short range compressor 112 (e.g., by bypassing long range compressor 106). On the other hand, if compressor grammar transform portion 114 does not contain such variables, the given segment of input data block 124 is processed by long range compressor 106 followed by short range compressor 112. In this case, only the uncompressed "literal" segments in the output of long range compressor 106 are processed by short range compressor 112. This adaptive compression selection mechanism provides a higher overall compression gain than always applying long range compressor 106 followed by short range compressor 112, ignoring the input data or compressor states.

The design parameters of long range compressor 106 and short range compressor 112 are optimized jointly such that the overall compressor provides the best trade-off between the compression gain and the resources needed for the implementation of the compression, e.g., the memory capacity (RAM) and the processing (CPU) power on both the server and the client ends of the network connection. The compression gain is maximized while the complexity (e.g., storage space and processing power) are held at reasonable levels.

Short range compressor 112 provides compressed data blocks 138, which are transmitted over communication link 126 and received by short range de-compressor 116. It is essential that communication link 126 provides a reliable transport or link layer to ensure that compressed data blocks 138 are delivered to short range de-compressor 116 in the order of transmission and without errors or lost blocks. Short range de-compressor 116 decompresses compressed data blocks 138 received over communication link 126 and reproduces data blocks consisting of the match descriptors and literal segments. In this non-limiting example embodiment, a grammar-based de-compressor is illustrated for short range decompression but any second order short range de-compressor may be used. Short range de-compressor 116 communicates with de-compressor grammar transform portion 118 via a signal 140. Grammar on the de-compressor side needs to be updated based on the information received over communication link 126 such that it is identical to the grammar on compression side 102, in order to achieve lossless decompression. Short range de-compressor 116 communicates with long range de-compressor 120 via a signal 142.

Long range de-compressor 120 receives match descriptors and literal segments from short range de-compressor 116 and reconstructs the input data block accordingly. It communicates with de-compressor byte cache 122 via a signal 144. De-compressor byte cache 122 needs to be updated based on the information received over communication link 126 such that it is identical to compressor byte cache 110 in order to minimize the data loss. Long range de-compressor 120 copies the matched byte segments from de-compressor byte cache 122 based on the information provided by signal 142. It places the decompressed blocks in the appropriate locations along with the literal segments to complete the construction of a decompressed block identical to the input block.

Figure 2:
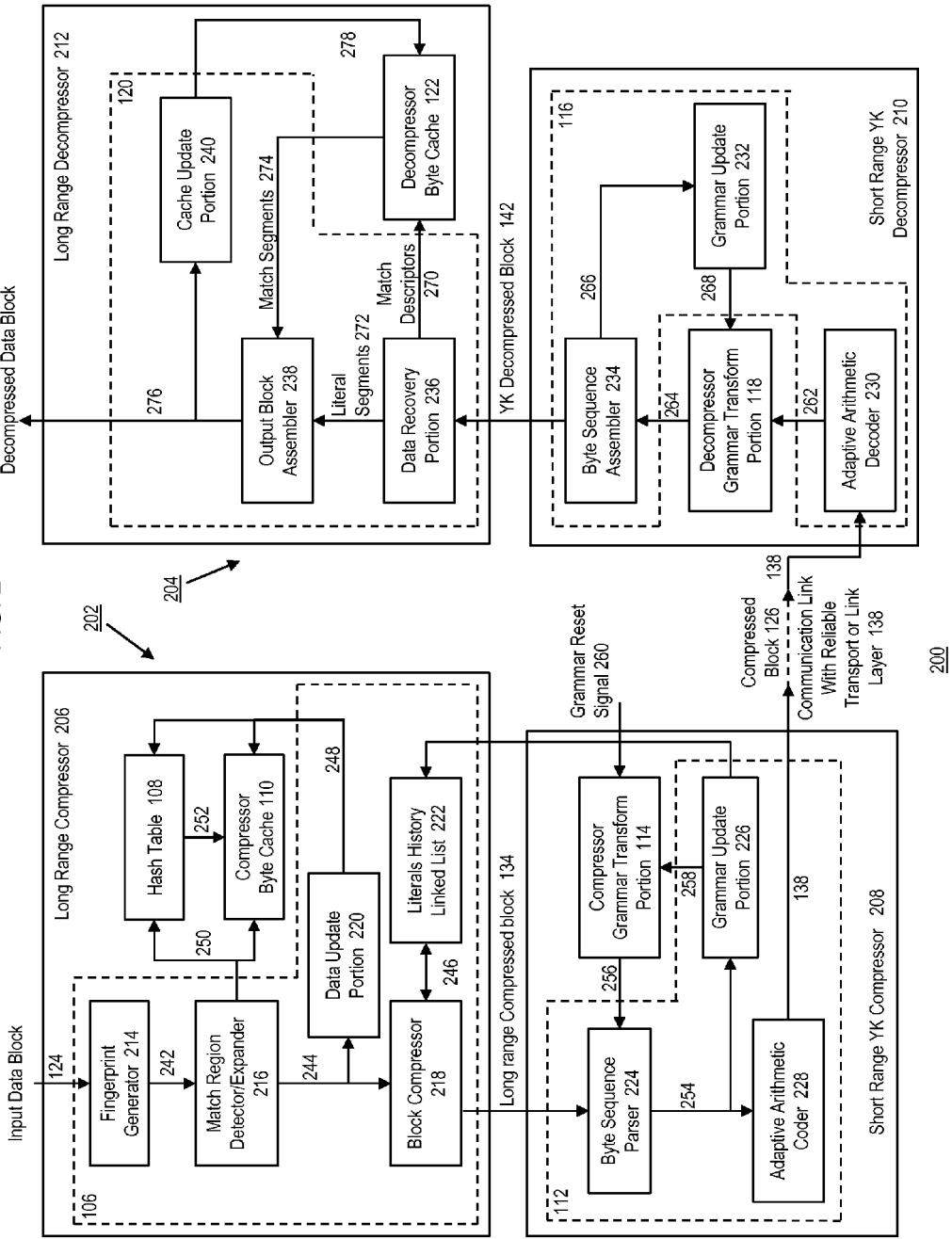
FIG. 2 illustrates an example embodiment of a communication system in accordance with an aspect of the present invention.

FIG. 2 illustrates an example embodiment of a communication system 200 in accordance with an aspect of the present invention. As illustrated in FIG. 2, communication system 200 includes a compression side 202 and a decompression side 204. Compression side 202 includes a long range compression portion 206 and a short range compression portion 208. Long range compression portion 206 includes long range compressor 106 (shown by a dotted region), hash table 108, and compressor byte cache 110 similar to FIG. 1, however the communication between different elements of long range compression portion 206 and its operation is explained in detail with reference to FIG. 2. Short range compression portion 208 further includes short range compressor 112, and compressor grammar transform portion 114 similar to FIG. 1, however the communication between different elements of short range compression portion 208 and its operation is explained in detail with reference to FIG. 2. Further, long range compressor 106 includes a fingerprint generator 214, a match region detector and expander 216, a block compressor 218, a data update portion 220 and a literals history linked list 222. In this illustration, each of fingerprint generator 214, match region detector and expander 216, block compressor 218, data update portion 220, literals history linked list 222, hash table 108 and compressor byte cache 110 are illustrated as distinct devices. However, at least two of fingerprint generator 214, match region detector and expander 216, block compressor 218, data update portion 220, literals history linked list 222, hash table 108 and compressor byte cache 110 may be combined as a unitary device. Short range compressor 112 further includes a byte sequence parser 224, a grammar update portion 226 and an adaptive arithmetic coder 228. In this illustration, each of byte sequence parser 224, grammar update portion 226, adaptive arithmetic coder 228 and compressor grammar transform portion 114 are illustrated as distinct devices. However, at least one of byte sequence parser 224, grammar update portion 226, adaptive arithmetic coder 228 and compressor grammar transform portion 114 may be combined as a unitary device.

Decompression side 204 further includes a short range decompression portion 210 and a long range decompression portion 212. Compression side 202 and decompression side 204 communicate with each other via communication link 126 having a reliable transport or link layer. Short range decompression portion 210 includes short range compressor 116 (as shown by dotted region), and de-compressor grammar transform portion 118 similar to FIG. 1, however the communication between different elements of short range decompression portion 210 and its operation is explained in detail with reference to FIG. 2. In this embodiment, a grammar-based de-compressor is used, however, any short range de-compressor may be used instead. Further, short range de-compressor 116 includes an adaptive arithmetic decoder 230, a grammar update portion 232 and a byte sequence assembler 234. In this illustration, each of adaptive arithmetic decoder 230, grammar update portion 232 and byte sequence assembler 234 and de-compressor grammar transform portion 118 are illustrated as distinct devices. However, in other embodiments, at least two of adaptive arithmetic decoder 230, grammar update portion 232 and byte sequence assembler 234 and de-compressor grammar transform portion 118 may be combined as a unitary device. Long range de-compressor 120 includes a data recovery portion 236, an output block assembler 238 and a cache update portion 240. In this illustration, each of data recovery portion 236, output block assembler 238, cache update portion 240 and de-compressor byte cache 122 are illustrated as distinct devices.

Focusing now on compression side 202, fingerprint generator 214 is arranged to receive a stream of data that includes sequence of contiguous blocks of data, which needs to be compressed, such as input data block 124. In one embodiment, input data block 124 is a byte stream comprising the internet traffic. The size of the block is variable and depends on the layer at which compression is applied in the network stack. For example, at the IP layer, the blocks may be IP pockets, or at the application layer, blocks may be segments of HTTP objects. As the data enters input data block 124, fingerprint generator 214 computes a fingerprint for each byte of data based on a fast sliding window. In one embodiment, a recursively computed Rabin fingerprint is used to minimize complexity but any known polynomial computation scheme for generating a fingerprint may be used. In one embodiment, fingerprint window is a 64 bytes window. Each fingerprint is a compact characterization of the byte sequence within its fingerprint window. If any two fingerprints match, the byte sequences within the corresponding windows will be identical with a high probability. Thus, duplicate byte sequences can be detected by comparison of their fingerprint values rather than a byte-wise comparison. A fingerprint is computed for each byte of input data block 124. The computed fingerprint has to be saved when the input block is added to compressor byte cache 110 after the compression of the block is completed. Since cache sizes can be large, it would be impractical to store all the fingerprints computed for each byte of the whole block. As such, a hash system is used to reduce the number of fingerprints saved in accordance with some embodiments of the present invention.

Consider the example the situation where, for a 228 byte cache, there may be 228 possible fingerprints, one for each possible distinct string of bits within compressor byte cache 110. In this example, consider that in input data block 124, only 1 out of every 64 fingerprints are retained. Therefore, as opposed to providing sufficient memory to store the possible 228 fingerprints, only enough memory is required to store 222 fingerprints. This would reduce storage space required for storing fingerprints and fingerprint metadata by a factor of 64. Hence a fingerprint selection process is used to discard most of the fingerprints and select only a small subset for storage. The key requirement for the selection criterion is that it should be position independent, for example, if two fingerprint windows, at two different positions in input data block 124, have identical data, the outcome of the selection criterion should be the same for both fingerprints. In order to meet such requirements, in an example embodiment, fingerprint generator 214 uses a criterion that selects only the fingerprints that have their last $\gamma$ least significant bits as zero, where $\gamma$ is an integer number. If the underlying data is random, this results in the random sampling of the computed fingerprints. The number of selected fingerprints is reduced by a factor of about $2\gamma$ relative to the total numbers of fingerprints computed.

As discussed above, fingerprint generator 214 computes and selects fingerprints for input data block 124. Before further discussing how the selected fingerprints are stored in hash table 108, operations of hash table 108 and compressor byte cache 110 will be now be discussed in detail. Hash table 108 is used to efficiently store the selected fingerprints of the data in compressor byte cache 110 and also to quickly find possible matches against the fingerprints computed for input data block 124. Hash table 108 communicates with compressor byte cache 110 via a signal 252. Each register in hash table 108 contains the fingerprint value and a metadata associated with that fingerprint. The metadata of a fingerprint is basically an index into compressor byte cache 110, and serves to point to the data from which it was computed. Metadata is used to map a fingerprint back to a byte sequence within compressor byte cache 110.

Fingerprints for the data in compressor byte cache 110, computed previously by an identical procedure, are held in hash table 108 as described earlier. The selected fingerprints for input data block 124 are compared against the fingerprints for the data in compressor byte cache 110, e.g., the fingerprints corresponding to the previously received blocks within the stream of data blocks. As discussed above, if there is a match between an input fingerprint and any of the cached fingerprint, it is indicative of a possible match between input byte sequence of input data block 124 in the fingerprint window and a sequence of bytes in compressor byte cache 110. This match has to be further verified to eliminate (i) the possibility that the byte cache fingerprint is stale, e.g., its data is no longer held in compressor byte cache 110 (because it was overwritten by newer data), and, (ii) fingerprint collisions, where two differing byte sequences result in the same fingerprint value. Once these possibilities are eliminated, it indicates a valid match that can form the basis of compression of that segment of input data block 124. Hash table 108 and compressor byte cache 110 receive a data update signal 248 from data update portion 220, which will be described later.

Match region detector and expander 216 communicate with hash table 108 and compressor byte cache 110 via a signal 250. Match region detector and expander 216 compares the fingerprints generated by fingerprint generator 214 for input data block 124 with the previously computed fingerprints stored in hash table 108 associated with the data stored in compressor byte cache 110. If the input fingerprint matches a fingerprint in hash table 108, a match may exist between the fingerprint window of input data block 124 and that of compressor byte cache 110. Note that the length of the match is at a minimum the length of the fingerprint window, but can be longer. In one embodiment, the fingerprint window is 64 bytes long. Longer matches lead to higher compression gain. To detect possible longer matches, the match region is expanded as much as possible both before and after the two matching fingerprint windows. Typically the match region could be expanded to thousands of bytes for long range compression.

The metadata of the matching fingerprint indicates the location of the fingerprint window in compressor byte cache 110. Each input byte to the left of the fingerprint window, starting with the first byte to the left of the fingerprint window, is compared against the corresponding cached byte in compressor byte cache 110. If there is a match, the match region expands by 1 byte to the left. This process continues to expand the match region, byte-by-byte to the left of the fingerprint windows until (i) there is no match, or (ii) the beginning of input data block 124 is reached, or (iii) the beginning of compressor byte cache 110 is reached, whichever occurs first. Similarly, the match region is also expanded to the right of the fingerprint window until (i) there is no match, or (ii) the end of input data block 124 is reached, or (iii) the end of compressor byte cache 110 is reached, whichever occurs first. After this expansion process is complete, a match has been detected between a segment of bytes (at least as long as a fingerprint window width, but possibly much longer) of input data block 124 and a segment of bytes stored in compressor byte cache 110. Once match region detector and expander 216 identifies an expanded match segment in input data block 124, it provides the relevant information to block compressor 218 via a signal 244 for compression and also to data update portion 220. Data update portion 220 communicates to hash table 108 and compressor byte cache 110 via signal 248. Data update portion 220 updates compressor byte cache 110 with the contents of input data block 124 for future matches.

In a non-limiting example embodiment, compressor byte cache 110 is implemented as a contiguous circular byte buffer scheme, with wrap-around occurring only at block boundaries. When a new input data block 124 is added to compressor byte cache 110 it overwrites the oldest data in compressor byte cache 110. If an entire input data block 124 cannot fit at the end of compressor byte cache 110, wrap-around occurs and the entire input data block 124 is added at the start of compressor byte cache 110. This ensures that input data block 124 is not split during wrap-around at the end of compressor byte cache 110. This considerably simplifies cache management, expansion of match regions and verification of stale fingerprints. The simplicity provided for verification of fingerprints also means that the size of the fingerprint metadata that has to be stored is much smaller, reducing storage complexity. Contiguous storage also allows expansion of match regions across (cached) block boundaries, leading to longer matches and improved compression gain.

Figure 3:
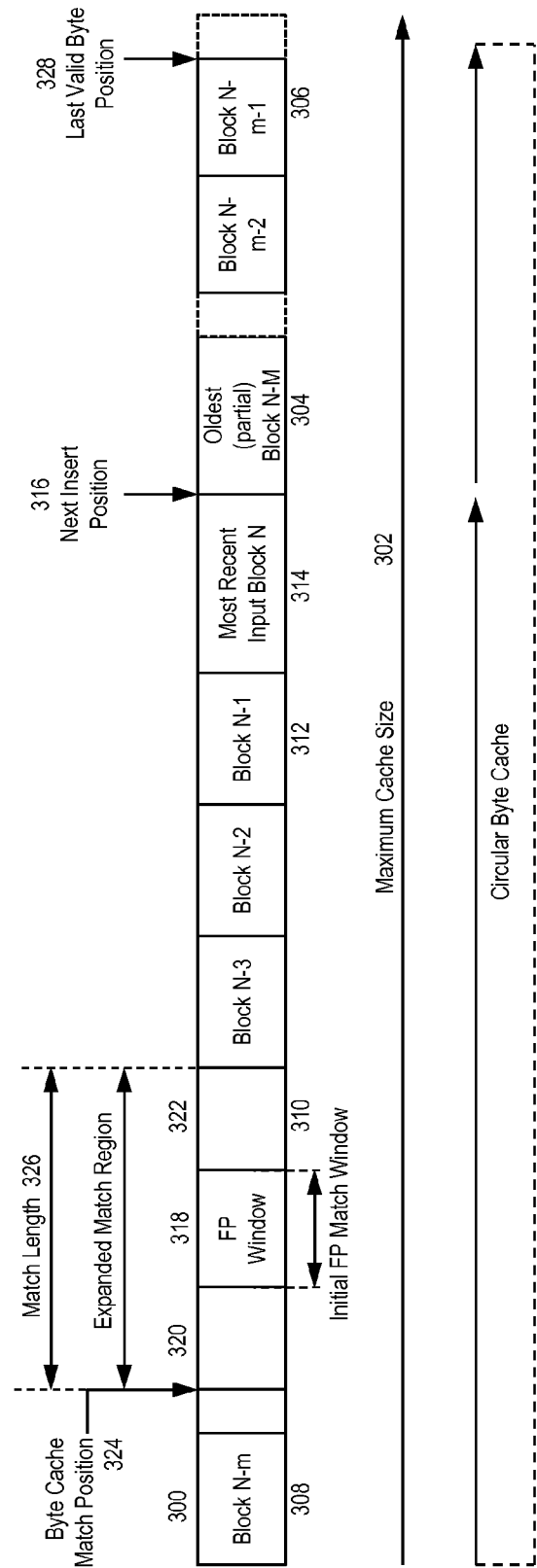
FIG. 3 illustrates an example embodiment of a circular byte cache in accordance with an aspect of the present invention.

FIG. 3 illustrates an example embodiment of a circular byte cache 300 in accordance with an aspect of the present invention. As illustrated in the figure, circular byte cache 300, with a maximum cache size 302, includes a plurality of segments, a sampling labeled as segments 304, 306, 308, 310, 312 and 314.

Segment 304 contains the oldest block in circular byte cache 300, which is about to be overwritten by the next block, indicated by a location 316. Segment 314 is the most recent block, which has been written in circular byte cache 300. Block 310 includes a region 318, a region 320 and a region 322. Region 318 corresponds to a fingerprint window of a cached fingerprint that matches a fingerprint in the current input block and that is detected by match region detector and expander 216. Accordingly, in this example, a consecutive string of data of the most recent input block, block 314, matches the consecutive string of data within region 318. As there is a match, the region is expanded beyond the initial window to the left (more recently received data) and to the right (less recently received data). Region 320 corresponds to an expansion of by match region detector and expander 216 to the right. Region 322 corresponds to a window created by match region detector and expander 216 to the left. Once the total matching is determined, the byte cache match position within circular byte cache 300 is known. Byte cache offset 324 indicates the start of expanded match region that matches with a segment in the most recent input block, block 314, whereas the total match length is represented by double arrows 326.

Circular byte cache 300 is implemented as a contiguous circular byte buffer, with wrap around occurring only at block boundaries, instead of breaking up a block across cache boundaries. When a new input block is added to circular byte cache 300, it overwrites the oldest data in the cache. If an entire input block cannot fit at the end of circular byte cache 300, wrap-around occurs and the entire block is added at the start of circular byte cache 300. For example, if a new block is too big to fit between next insert position 316 and last valid byte position 328 then instead of splitting up the block across cache boundaries, it is added at the start of segment 308. Implementation of circular byte cache 300 as a contiguous circular byte buffer, considerably simplifies cache management, expansion of match regions and verification of stale fingerprints. The simplicity provided for verification of fingerprints also means that the size of the fingerprint metadata that has to be stored is much smaller, reducing storage complexity. Contiguous storage also allows expansion of match regions across (cached) block boundaries, leading to longer matches and improves compression gain.

Compressor byte cache 110 and de-compressor byte cache 122 are example embodiments of circular byte cache 300, in accordance with aspects of the invention. Implementation of circular byte cache 300 as a contiguous circular byte buffer, with wrap-around only at block boundaries, has a number of advantages over block based or generic circular buffer based schemes. The contiguous storage of bytes translates to less wasted storage space when compared to block based storage. Contiguous storage also allows expansion of match regions across (cached) block boundaries, which is not possible when caching is done in terms of blocks. Block based caching typically requires the use of an absolute linear block index in order to detect stale fingerprints. This type of indexing has two problems: (i) the index, which is several bytes long, needs to be stored as part of the fingerprint metadata, increasing storage complexity, and (ii) when the linear index ultimately wraps around, this event has to be detected and appropriate measures taken, which introduces complexity. In contrast, the contiguous circular byte buffer proposed here overcomes these problems, uses less storage space, is simpler to implement and also improves compression gain.

Along with updating compressor byte cache 110, data update portion 220 also updates hash table 108 with the selected fingerprints for input data block 124 along with the metadata. Note that the metadata corresponds to input data block 124 that was just inserted into compressor byte cache 110. Given a fingerprint value to be stored in hash table 108, a hash function is used to compute an index to a slot of hash table 108. An attempt is made to insert the fingerprint into the hash slot. Any matched fingerprint, regardless of whether its matching fingerprint was valid, stale or had a fingerprint collision, simply overwrites the existing metadata in the slot. This ensures that the hash table metadata entry for a fingerprint always points to the newest occurrence of a byte segment in compressor byte cache 110. An unmatched fingerprint is inserted successfully only if the slot is unoccupied or contains a stale fingerprint. Even if a large number of fingerprints fail to be inserted, it is not detrimental to performance as explained below.

As new data is inserted into compressor byte cache 110, it overwrites older data. However, hash table 108 may continue to hold the fingerprints that correspond to the overwritten data. Such stale fingerprints are only deleted on an as-needed basis; e.g., if a new fingerprint needs to be inserted into a slot occupied by a stale fingerprint. A stale fingerprint is detected by recomputing the fingerprint value using the data pointed to by the metadata. If the recomputed fingerprint does not match the stored fingerprint, it indicates that the fingerprint has become stale. e.g., the data from which it was computed has since been overwritten by newer input data. Such a stale fingerprint can be overwritten by the fingerprint going to be inserted. This approach of detection of stale fingerprint considerably reduces the amount of storage needed to hold the metadata and also simplifies the implementation of compressor byte cache 110 by avoiding the need for absolute indexing.

The degree to which hash insertion failures occur depends upon the loading factor of hash table 108 (e.g., the number of hash table slots divided by the number of byte cache fingerprints that have to be inserted into hash table 108) as well as the hash function used. It is desirable to keep the loading factor low to minimize the storage complexity of hash table 108. On the other hand, if this loading factor is too small, hash collisions occur, e.g., cases where a fingerprint cannot be inserted because its slot is occupied by a different fingerprint. If a fingerprint is not inserted, a potential duplication of the data within the fingerprint window cannot be detected, resulting in loss of compression gain. Therefore, design of hash table 108 is a tradeoff between storage complexity and performance. It is possible to alleviate this by using multiple hash functions. However, it was found that for the purposes of long range compression, it is possible to tolerate relatively high rates of hash collision and measures such as bucketed hashing and multiple hash functions were not critical. This occurs since the typical match region is much longer than a fingerprint window. Consequently a match region contributes a number of selected fingerprints. Even if some of the selected fingerprints fail to be inserted, as long as the other (even a single) fingerprint is successfully inserted, the entire match region will be detected. The key contributor is the expansion of match regions once a fingerprint match is found.

Returning to FIG. 2, block compressor 218 receives input data block 124 along with the information for the matched segment from match region detector and expander 216. Block compressor 218 is operable to perform long range compression of the matched segment and also to determine which bytes need to be passed along as literal segments to short range compression portion 208. However, under certain conditions, encoding the expanded matched segment of input data block 124 in to a match descriptor may not be the most efficient strategy. It may be more efficient to do short range compression instead of long range compression for certain segments of data blocks. This is explained further with reference to literals history linked list 222.

If short range compressor 112 was used to compress a pervious occurrence of an identical byte segment (or a byte segment containing the current byte segment), short range compressor 112 is more likely to be more efficient than long range compressor 106 for such a segment. This determination also has to take into account the length of such a segment, as longer segments are an exception to this rule. To make this determination, long range compressor 106 maintains a list of descriptors of the literal segment in literals history linked list 222 that were passed on to short range compressor 112. When an expanded match segment is identified in input data block 124, with its length exceeding a minimum length threshold, literals history linked list 222 is checked to see if it is contained in the list. If the segment is in literals history linked list 222, then such a segment is not compressed into a match descriptor; instead it is directly passed in literal form to short range compressor 112 for compression. If the segment is not in literals history linked list 222, then such a segment is compressed by block compressor 218. Block compressor 218 communicates with literals history linked list 222 via a signal 246. Updating of literals history linked list 222 with reference to grammar update is explained further in context of short range compressor 112.

Block compressor 218 is operable to compress the expanded matched segment of input data block 124 by replacing it entirely by a "match descriptor" containing (i) the position of the starting byte of the match in compressor byte cache 110, (ii) the position of the starting byte of the match in input data block 124, and (iii) the length of the match. Since the match descriptor can be only a few bytes long, whereas the match segments can be several tens, hundreds or even larger number of bytes, significant compression gains can be achieved. The match descriptor is all the information needed by long range de-compressor 120 to extract the byte segment from de-compressor byte cache 122, so that input data block 124 can be exactly reconstructed.

In certain cases, input data block 124 may contain zeros or more such match regions, interspersed with "literal" regions, for which no match was available in compressor byte cache 110. Each match region is replaced by a match descriptor and the literal bytes are preserved exactly and passed on to short range compressor 112 for second stage of compression. Block compressor 218 provides a long range compressed block for each input data block 124 processed to short range compressor 112 via a signal 134. Long range compressed block includes information about block length, match count, match descriptors and literal byte segments.

Figure 4:
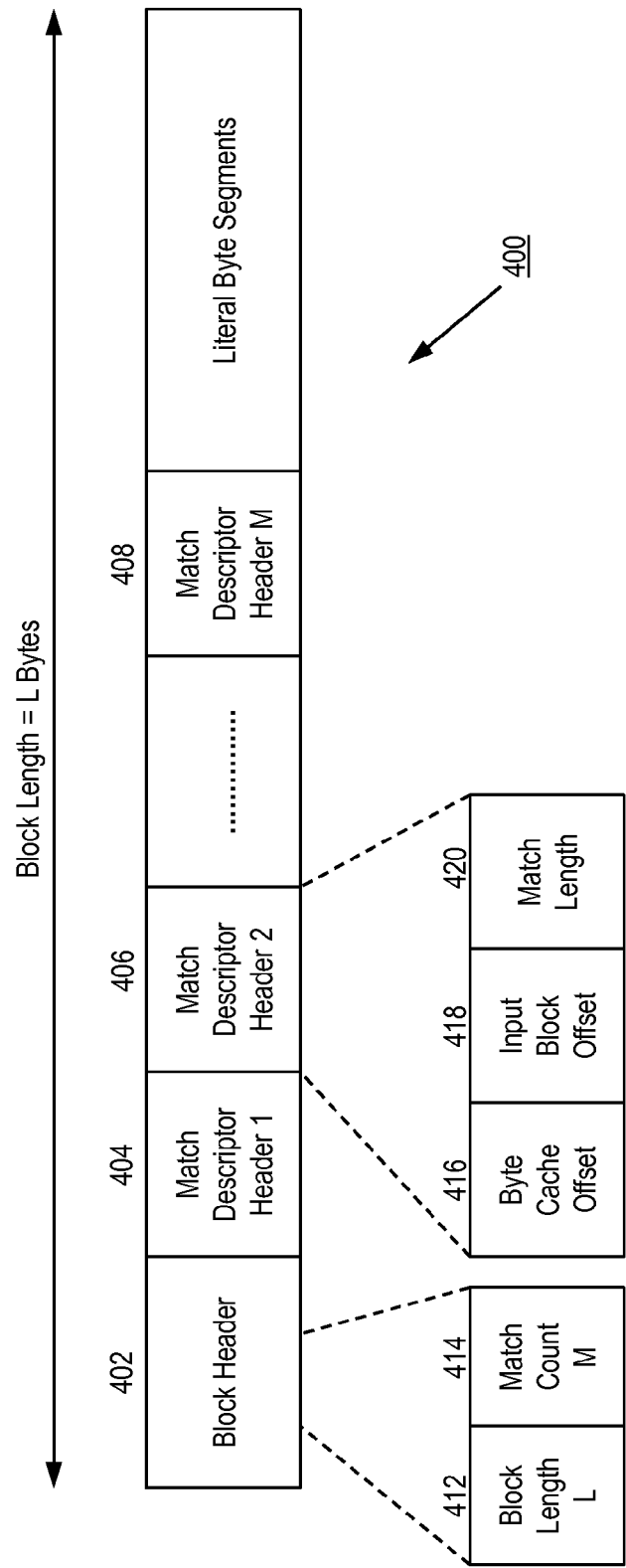
FIG. 4 illustrates an example embodiment of a long range compressed block in accordance with an aspect of the present invention.

FIG. 4 illustrates an example embodiment of a long range compressed block 400 in accordance with an aspect of the present invention. As illustrated in the figure, long range compressed block 400 includes a block header field 402, a plurality of match descriptor header fields (examples shown as a match descriptor header field 404, a match descriptor header field 406, a match descriptor header field 408) and a literal byte segments field 410. Block header field 402 further includes a block length field 412 and a match count field 414. Block length field 412 indicates total number of bytes in long range compressed block 400. Match count field 414 indicates total number of match segments that were found in input data block 124. Each match descriptor header field includes a byte cache offset field, an input block offset field and a match length field. For example, match descriptor header field 406 includes a byte cache offset field 416, an input block offset field 418 and a match length field 420. Note that all match descriptor header fields 1, 2, . . . , M have the same format as match descriptor header field 406, even though only match descriptor header field 406 is shown here in expanded form. Byte cache offset field 416 corresponds to byte cache offset 324 of circular byte cache 300 of FIG. 3. In particular, byte cache offset field 416 indicates the offset location with respect to the beginning of compressor byte cache 110, where the match was found. Input block offset field 418 indicates the offset byte with respect to the beginning of input data block 124, where the match was found. Match length field 420 indicates the length of the matched segment in bytes. Match count field 414 and match descriptor fields 416, 418 and 420 may be compressed using a variable length code. Each of these entities may be encoded using the 7 least significant bits of one or more bytes, with the most significant bits serving as "continuation bits." If the entity is small enough to be encoded using the 7 least significant bits of all the bytes so far used, the most significant bit is set to zero. Having the most significant bit set as a zero indicates that the byte is the last byte used in encoding the entity. Having the most significant bit set as a 1 means that the next byte was also used in encoding the entity and decoding should continue until a byte with 0 in its most significant is found. Match count, offsets and match lengths tend to be small values most of the time, but can occasionally take on large values. The variable length scheme provides significant savings in representing these values.

Figure 5:
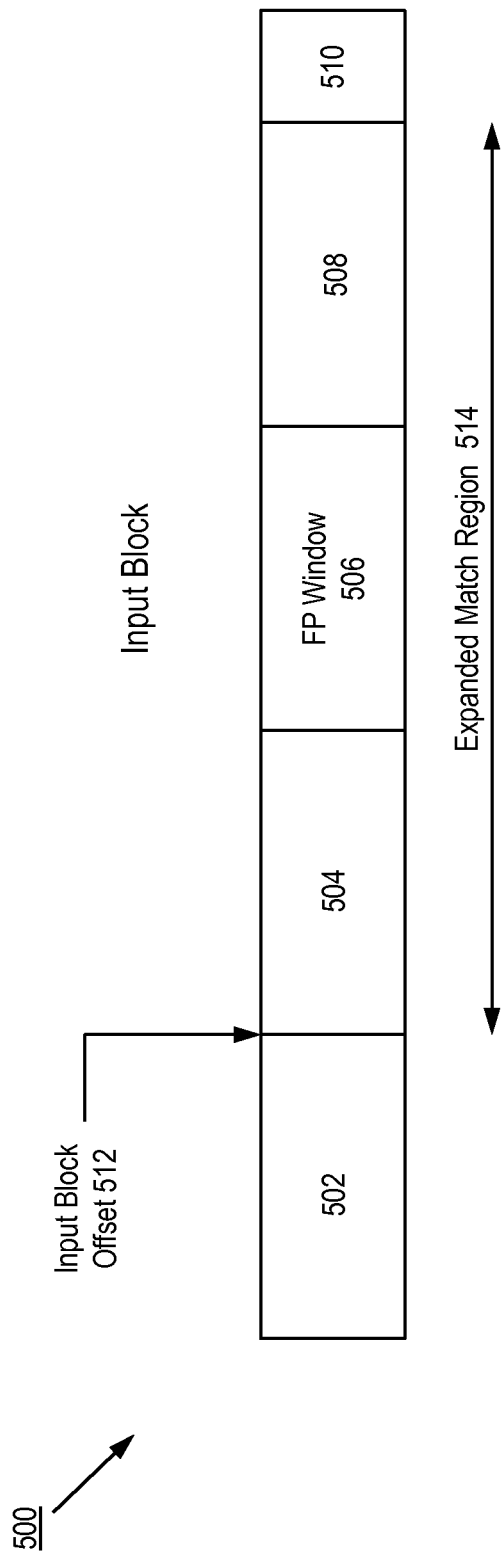
FIG. 5 illustrates an example embodiment of an input block in accordance with an aspect of the present invention.

FIG. 5 illustrates an example embodiment of an input block 500 in accordance with an aspect of the present invention. Input block 500 corresponds to a block of data input into block compressor 218 from match region detector and expander 216. As illustrated in the figure, input block 500 includes a segment 502, a segment 504, a segment 506, a segment 508 and a segment 510. In one embodiment, an input block offset 512 indicates the start of segment 504, segment 506 indicates a fingerprint window and segments 504, 506 and 508 together mark the expanded match region equivalent to match length 420. Input block offset 512 corresponds to input block offset field 418 of long range compressed block 400 of FIG. 4. Segment 506 corresponds to the window created by fingerprint generator portion 214 and additionally corresponds with region 318 of circular byte cache 300 of FIG. 3. Segment 506 was compared with a similar sized window from previous bytes and found to match. The match region, segment 506, was then extended in the left direction until there was no longer matching consecutive bits. This extended match region, segment 504, corresponds to region 320 of circular byte cache 300 of FIG. 3. The match region, segment 506, was additionally extended in the right direction until there was no longer matching consecutive bits. This extended match region, segment 508, corresponds to region 322 of circular byte cache 300 of FIG. 3. In other words, there is a match in input block 500 starting at byte location 512 with a segment in a byte cache, where the match length corresponds to an expanded match region indicated by the double arrows 514. Block compressor 218 creates a match descriptor header for each matched segment found in input data block 124. If no matched segment were found then there are no match descriptor headers and the match count field 414 is zero. Literal byte segments field 410 contains the unmatched bytes in input data block 124, in exactly the same order of occurrence in input data block 124. If all the bytes in the input data block 124 was matched to one or more segments in compressor byte cache 110, literal byte segments field 410 is empty, e.g., has zero bytes.

Returning to FIG. 2, output of block compressor 218 is received by short range compression portion 208. Byte sequence parser 224 is operable to receive signal 134 from block compressor 218 and a signal 256 from compressor grammar transform portion 114. Short range compressor 112 uses byte sequence parser 224 to find out the longest prefix of new data it has received that is already representable by an existing grammar symbol. Byte sequence parser 224 parses the incoming byte sequence on signal 134 based on the existing grammar symbols in compressor grammar transform portion 114. Once byte sequence parser 224 is done parsing for each grammar symbol, it communicates to grammar update portion 226 via a signal 254 to update the grammar by possibly adding a new symbol, or modifying a existing symbol.

In accordance with another aspect of the present invention, short range compressor 112 may provide a feedback signal to long range compressor 106 to affect operation of long range compressor 106. Grammar update portion 226 also keeps track of when the grammar in compressor grammar transform portion 114 needs to be reset. It provides a signal 260 to compressor grammar transform portion 114 to initialize the grammar. In this embodiment of short range compressor 112, signal 260 is also fed to reset literals history linked list 222. Therefore, literals history linked list 222 is reinitialized whenever the grammar is initialized, and hence contains only the literals since the most recent grammar initialization. This means that the grammar for short range compressor 112 has variables that can compactly represent future occurrences of such literal segments.

When an expanded match segment is identified in input data block 124, with its length not exceeding a maximum length threshold, the literals list is checked to see if it is contained in the list. If this is true, then such a segment is not compressed into a match descriptor; instead it is directly passed in literal form to short range compressor 112 for compression. If this is not true, such a match segment is compressed by long range compressor 106 as described earlier. Note that the selective compression strategy does not require that any indication of this choice be passed to the decompression portion 204.

Adaptive arithmetic coder 228 maps the sequence of symbols received from byte sequence parser 224 into bits. It is based on the presumption that certain grammar symbols occur more often than others. Adaptation allows updating of tables keeping track of frequency of occurrence for incoming symbols while processing the data, which improves the compression ratio of the coders. Adaptive arithmetic coder 228 follows the entropy encoding technique, which suggests that the symbols that are likely to occur more often can be represented using fewer bits. When a sequence is processed by arithmetic encoding, frequently used symbols are represented with fewer bits and not-so-frequently used symbols are represented with more bits, resulting in overall reduction in number of bits used. Adaptive arithmetic coder 228 provides efficiently compressed and encoded output 138 ready for transmission.

Output of short range compressor 112 is transmitted over communication link 126. It is essential that communication link 126 provides a reliable transport or link layer to ensure that compressed blocks 138 are delivered to decompression portion 204 in the order of transmission and without errors or lost blocks. Short range decompression portion 210 performs the inverse operation of short range compression portion 208, in order to reproduce blocks consisting of match descriptors and literal segments from compressed blocks 138. Adaptive arithmetic decoder 230 receives compressed block 138 from communication link 126, which were encoded by adaptive arithmetic coder 228. In order to decode the bits back to symbols such that the decoded symbols exactly match with the encoded symbols on compression side 202, frequency tables in adaptive arithmetic decoder 230 should be updated in the same way and in the same step as in adaptive arithmetic coder 228. Adaptive arithmetic decoder 230 provides decoded symbols 262 to de-compressor grammar transform portion 118.

De-compressor grammar transform portion 118 works with grammar update portion 232 to provide decompressed grammar transform of the symbols in to bytes to byte sequence assembler 234. Note that short range de-compressor 116 needs to be aware of the grammar transforms and updates on short range compressor 112 side such that the grammars on both compressor and de-compressor sides are identical, in order to recover original input data block 124. Byte sequence assembler 234 receives a signal 264 from de-compressor grammar transform portion 118 and is operable to assemble the bytes in to proper format of decompressed block 142, which includes match descriptors and literal segments. The format of decompressed block 142, which is identical to compressed block 134, will be explained further on with the help of FIG. 4. Byte sequence assembler 234 updates grammar update portion 232 by adding any new symbols via a signal 266. Short range decompression portion 210 provides decompressed block 142, which includes match descriptors and literal segments, to long range decompression portion 212. Long range decompression portion 212 performs the inverse operation of long range compressed portion 206, in order to reconstruct input data block 124 based on the decompressed match descriptors and literal segments.

Long range decompression portion 212 includes long range de-compressor 120 (as shown by dotted line), and de-compressor byte cache 122 similar to FIG. 1, however the communication between different elements of long range decompression portion 212 and its operation is explained in detail with reference to FIG. 2. Data recovery portion 236 is operable to receive decompressed match descriptors and literal segments from decompressed block 142. Based on the format of decompressed block 142, as discussed in FIG. 4, it separates out the match descriptors and literal segments. Data recovery portion 236 provides match descriptors 270 to de-compressor byte cache 122, which indicates the number of bytes that need to be fetched and the starting address of the byte segment in de-compressor byte cache 122. Data recovery portion 236 provides literal segments 272 to output block assembler 238. De-compressor byte cache 122 fetches matched segments based on the starting address and match length provided in match descriptor and provides matched segments 274 to output block assembler 238. Note that long range decompression portion 212 needs to be aware of the updates in compressor byte cache 110 such that the cache contents on both compressor and de-compressor sides are identical, in order to recover original input data block 124. De-compressor byte cache 122 also receives a signal 278 from cache update portion 240 in order to add the byte segments which have been decompressed. Accordingly, as is evident, the de-compressor cache must always track the compressor cache (e.g., in its cache state, dictionary state, or grammar state, etc.).

Output block assembler 238 reconstructs input data block 124 based on literal segments 272 received from data recovery portion 236 and matched segments 274 received from de-compressor byte cache 122. A block header, illustrated in FIG. 4 later on, indicates the number of match descriptors contained in compressed block 138 received from compressor portion 202. Each match descriptor specifies where the matched bytes are in de-compressor byte cache 122, the length of the match and the location of the match segment in decompressed block 142. Output block assembler 238 simply has to construct the matched part of the block by simply copying the matched byte segments 274 from de-compressor byte cache 122 and placing them in the correct locations of decompressed block. This can possibly leave unfilled gaps in the decompressed block, corresponding to the literal segments. Each unfilled gap can then be filled using the literal segment 272, since these bytes occur in exactly the same order as they appeared in input data block 124. This completes the construction of a decompressed block 276 identical to input data block 124. Similar to data update portion 220 in long range compression portion 206, cache update portion 240 in long range decompression portion 212 adds decompressed block 276 to de-compressor byte cache 122 in order to overwrite the oldest bytes. This is performed to make sure that the updated de-compressor byte cache 122 is identical to compressor byte cache 110 so that future input data block 124 is decompressed correctly.

The selective compression of input data block 124, depending on the input characteristics, compressor byte cache 110 contents and the state of the grammar, results in improved compression gain over schemes that process each input segment by the same processing steps of long and/or short range compression. The joint optimization of the long range and short range compression is an advantage over techniques that apply only long term compression or only short term compression or apply the two independently such that they are unaware of each other. There is a significant degree of interdependence between the performances of the two stages of compression. Consequently, it is important to optimize the design parameters of the long range compressor 106 taking into consideration the behavior of the short range compressor 112. Extensive parametric studies were conducted to determine the optimal parameters such as minimum match length, fingerprint window length, fingerprint selection rate, size of the byte cache and the size of the grammar. The compression gain of only long term compression portion 206 increases as the minimum match segment size is reduced, because smaller matches can be detected and compressed. However, this reduces the performance of short range compressor 112 to the degree that the overall compression gain deteriorates with reducing minimum match length. The reason for this behavior is that the smaller matches disrupt the continuity of the byte sequence at the input of short range compressor 112 (e.g., many smaller literal segments). This makes it more difficult for compressor grammar transform portion 114 to find the underlying structure. Therefore, it is preferable to use a larger value for the minimum match length, such that the overall compression gain is maximized.

According to example embodiments of the present invention, an architecture and approaches are provided, consisting of three sequential compression stages, where each stage reflects a progressive increase in granularity, resulting in a scalable approach that exhibits improved efficiency and compression performance. By way of example, the first stage comprises a block-level compressor that determines redundancies on an input block-level basis (based on entire input blocks of data, as opposed to partial matching based on segments within the input block of data). Analysis of internet traffic reveals that, in various scenarios, the traffic content exhibits a significant level of large-scale redundancies. For example, some segments of an object (typically comprising tens or hundreds of bytes or more) may be duplicated as parts of previously transmitted objects, and some byte sequences (typically a few bytes long) occur more frequently than others (e.g., when transmitting content with HTML/CSS/Javascript keywords). Further, in the case of web browsing, an entire web object may be repeatedly transmitted on a communications link (e.g., when a user repeats the request for a web page or an object within a web page, which cannot be served from the web browser cache), or certain content may be duplicated on multiple different pages at different sites (e.g., advertisements—where, in the context of targeted advertising, the same ads are even more likely to be delivered to a particular user from different sites and even during different browsing sessions). Accordingly, Internet traffic, which can constitute a significant portion of the total traffic over communications systems links, exhibits a high degree of large-scale redundancies (e.g., block-level redundancies). The ability for lossless data compression techniques to fully exploit such redundancies in a scalable and efficient manner would thus achieve significant conservation of communication link resources (such as channel bandwidth and power), as well as significantly improved performance (e.g., lower latency and faster response time, which translates into an improved user experience).

The first stage block-level lossless compression approaches of the present invention address such large-scale redundancies in both a scalable and efficient manner (e.g., from the standpoints of both complexity and computing resources and minimization of required memory resources). According to example embodiments, these approaches are protocol independent—they are agnostic to the higher layer protocols, applications and data types. In other words, the compression approaches treat the input data simply as a block of bytes (rather than a specific type of entity, such as an HTTP object), and thus are agnostic to the data type/format itself. Higher layers are thus not required to present the data in a format customized for the compression algorithm. For example, in the case of HTTP traffic, the upper layer is not required to present the data input as an entire HTTP object. The higher layer is free to provide an HTTP object as a whole or segmented into multiple segments or "blocks." In either case, the HTTP traffic is simply treated as data blocks, wherein block duplications are detected and compressed accordingly. Accordingly, a significant advantage of the compression approaches of embodiments of the present invention is that they can be applied at any layer of the network protocol stack that provides a reliable, in order delivery, facilitating broad applicability (e.g., the compression can be employed at the application layer with respect to byte streams comprising HTTP objects, or at the network layer with respect to the corresponding IP packets. Moreover, the "range" over which redundancies occur in the data stream (e.g., the separation in terms of the number of transmitted bytes from an occurrence of a byte segment to a redundant occurrence of the same segment) can span from a few bytes to several tens or hundreds of megabytes. This range is dependent on several factors such as the type of content, speed of the link, usage pattern of the user, the number of users attached to the end point, etc. Accordingly, a further advantage of the compression approaches of embodiments of the present invention is that they facilitate the exploiting of redundancies across a large range without imposing corresponding increased storage requirements on the compressor end of the communications link.

Figure 6A:
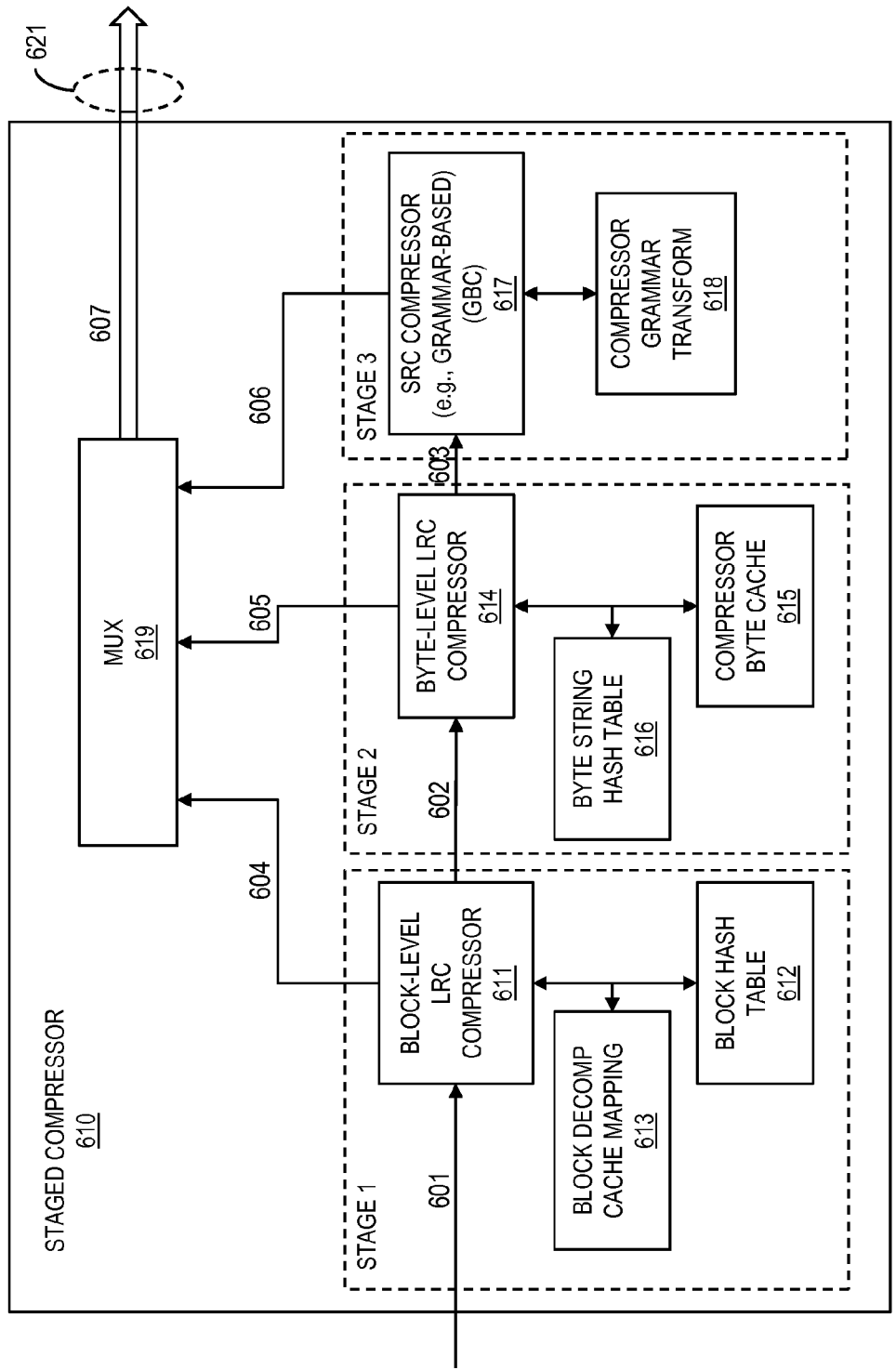
FIG. 6A illustrates a block diagram depicting the architecture of a staged compressor, including a block-level compression stage, in accordance with example embodiments of the present invention.

FIG. 6A illustrates a block diagram depicting the architecture of a staged compressor 610, including a block-level compression stage (Stage 1), in accordance with example embodiments of the present invention. The staged compressor 610 comprises a multiplexer (MUX) 619, a short-range compression (SRC) compressor 617 (e.g., grammar-based compressor GBC) and associated compressor grammar transform 618, a byte-level long-range compression (LRC) compressor 614 and associated compressor byte cache 615 and byte string hash table 616, and a block-level long-range compression (LRC) compressor 611 and associated block hash table 612 and block decompressor cache mapping 613. The first stage (Stage 1) seeks to compress input blocks 601, each as a whole. Traditionally, such a block-level compression would occur with reference to a block cache storing the data of a number of entire previously transmitted blocks. Block-level compression is possible when an identical block was transmitted as part of the same flow (e.g., the byte stream from the hub to a specific remote), and this block is stored within the block cache. It follows that, in order to fully exploit block-level duplications (e.g., in web traffic), the compressor cache would have to be relatively large (e.g., several 10's or 100's of MB), as compared to the cache of a byte-level compressor (e.g., as deployed in the second stage). Thus, the design of a traditional block cache requires a trade-off between the compression gain and the storage cost, a trade-off that is further complicated in the case of a hub that supports thousands of remote terminals (e.g., in a satellite system).

According to example embodiments of the present invention, therefore, such design challenges are addressed by the detection of redundant blocks based on hash values corresponding to the respective input blocks. By way of example, the block-level LRC 611, of the first stage, compresses input blocks based on a block hash table 612. More specifically, for each input block received by the block-level LRC 611 compressor, the compressor computes the hash value based on a collision-resistant hash function and stores the hash value in the block hash table 612. In one embodiment, the block hash table 612 is configured as a bucketed hash table stored in a memory efficient manner in order to facilitate efficient detection of matching hash values. A hash function applied to a number of bytes of data traffic comprises application of a mathematical operation on the data to reduce the data size by a significant factor (e.g., applying a mathematical function to a block of data traffic of say 1500 bytes and generating a hash value of say 8 or 16 bytes). Depending on the hash function applied, it is possible for two different blocks of data to result in the same hash value, which is referred to as a collision. To avoid hash collisions, collision-resistant hash functions reduce the probability of a collision to a statistically insignificant level (e.g., a probability of collision on the order of $2^{-64}$) by generating larger hash values (e.g., 128 bytes or 256 bytes in length) where the likelihood of a collision is relatively impossible in the context of the size of the data blocks being handled in this compression stage. In this embodiment, for example, the compressor applies a SHA-1 hash function to each received input block. While the present example embodiment is presented as comprising a SHA-1 hash function as a basis for determining block-level matches by the block-level compressor, it will be readily apparent that any one of a number of such collision-resistant hash functions may be employed without departing from the spirit of embodiments of the present invention.

Accordingly, when each new input block is received at the block-level LRC 611 compressor, the compressor first computes the respective hash value for the input block, and then determines if that hash value matches the hash value corresponding to a prior input block stored in the block hash table 612. If no match exists, the compressor determines that the input block is not a duplication of a prior received input block within the range of the input blocks reflected by the block hash table. In that event, the block-level compressor does not perform any compression with respect to that particular input block, which does not reflect a match. Instead, the compressor simply passes that input block on to the second stage byte-level compressor (Stage 2). If a match is detected, the compressor determines that the input block is a duplication of the prior received input block reflected by the matching hash value stored in the block hash table. In that event, compression by the first stage is possible. Regardless of whether a match is detected or not, the block level LRC does not store the input block of bytes in a cache. Only the collision-resistant hash of the block is added to the hash table. This permits the compressor to operate as if it has a large memory, without actually requiring the storage space for storing the blocks. It should be noted that the determination of whether an input block is a duplication of a prior input block represents an assumption based on matching hash values, but that such an assumption can be made with a very high probability, since the block hash is a strong collision resistant hash (e.g., SHA-1). For example, a 20 MB block hash table can store one million SHA-1 hash values, which is equivalent to storing one million respective data blocks of say 1500 packets each (a 20 MB hash cache achieves the equivalent storage of a 1.5 GB cache, which reflects a history of one million data blocks as a basis for compression matches).

Figure 6B:
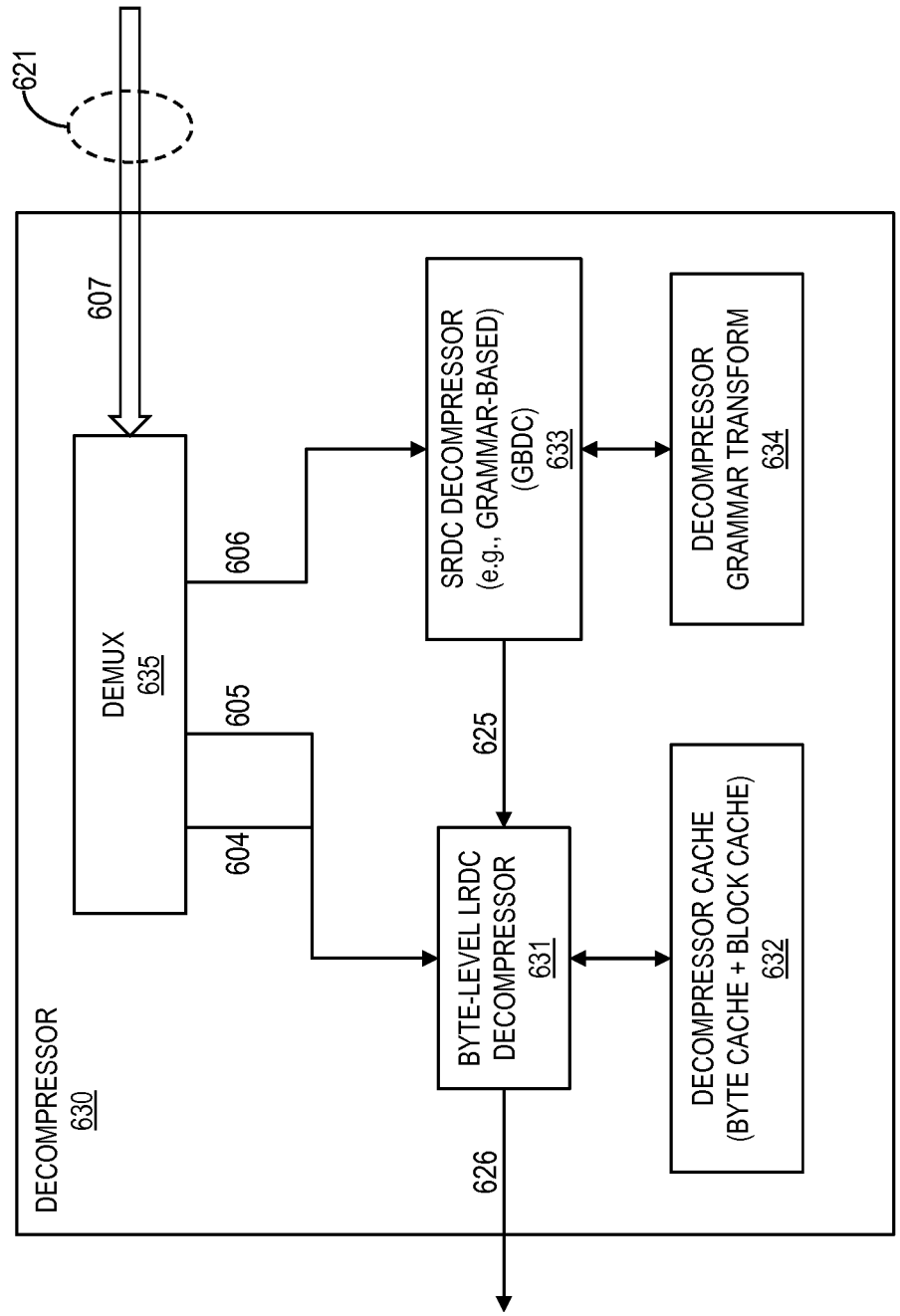
FIG. 6B illustrates a block diagram depicting the architecture of a decompressor, for decompressing packets compressed by the staged compressor of FIG. 6A, in accordance with example embodiments of the present invention.

At the decompressor end, FIG. 6B illustrates a block diagram depicting the architecture of a decompressor 630, for decompressing packets compressed by the staged compressor 610 of FIG. 6A, in accordance with example embodiments of the present invention. The decompressor 630 comprises a demultiplexer (DEMUX) 635, a short-range decompression (SRDC) decompressor 633 (e.g., grammar-based decompressor GBDC) and associated decompressor grammar transform 634, and a byte-level long-range decompression (LRDC) decompressor 631 and associated decompressor cache 632. The byte-level LRDC decompressor 631 stores each uncompressed input block (corresponding to the input blocks received by the block-level LRC compressor 611) in the decompressor cache 632. It should be noted that, with respect to compression on the outroutes from the hub, the transmissions are received by the respective supported terminals, where there is no scalability issue, because each terminal need only maintain one decompression cache for received traffic.

Correspondingly, with reference again to the compressor end (FIG. 6A), the compressor maintains information in the block decompressor cache mapping 613 that specifies the respective storage locations of the respective input blocks stored within the decompressor cache 632. When a block match is detected (based on a match between collision resistant hash values), the compressor retrieves the storage location information for the respective block stored in the decompressor cache, and provides to the decompressor a block-level match indicator, along with a "match descriptor" (e.g., the respective decompressor cache match location and length information), in place of the matched input block. For example, the input block is compressed by removing the block from the data stream, and transmitting to the decompressor the block-level match indicator, along with the match descriptor comprising a location address or index (e.g., a relative location index pointing to the beginning of the respective data block) and the length of the matching data block, as stored in the decompressor block cache. In other words, the entire block is removed from the data stream, achieving virtually a 100% compression rate for that block, and thus no further compression need be performed with respect to that block.

With reference again to the decompressor end (FIG. 6B), in the cases where the compressor compresses an input data block based on a matching hash value, and provides the block-level match indicator and respective match descriptor to the decompressor, the decompressor receives that information, enabling it to reconstruct the decompressed input block based on the respective data stored in the decompressor cache 632. Particularly, based on the received indicator and associated location and length information, byte-level LRDC decompressor 631 accesses the corresponding location in the decompressor cache 632, retrieves the respective block of data, and inserts that data back into the data stream to reconstruct the original input data block. The decompressor then adds each decompressed data block to the decompressor cache. In one embodiment, the decompressor cache comprises a circular buffer, wherein newly added blocks are overwritten over the oldest data in the buffer, and the data wraps-around at the end of the data buffer.

According to further aspects of the invention, the compressor keeps track of stale hash values (e.g., hash values corresponding to data blocks that have been overwritten in the decompressor cache 632) stored in the block hash table 612. In other words, even though the compressor does not maintain the block cache, it keeps track of the older blocks that get overwritten at the decompressor. By way of example, with respect to each input block (whether or not compressed at the first stage), the block-level LRC compressor 611 determines the respective older blocks that will be overwritten by the decompressor storage of the data block at the respective storage location within the decompressor cache 632. The compressor can determine this information, because it tracks the contents of the decompressor cache in order to be able to provide the data pointers or indexes to the decompressor for reconstructing the compressed blocks. Based on the determination of the respective data blocks that are overwritten in the decompressor cache, the compressor marks the respective hash values in the block hash table as "stale." In detecting block duplications, the compressor excludes such stale block hashes, in order that the compressor does not declare a match against an older block that has already been overwritten (and hence is unavailable) at the decompressor.

By way of example, in order to detect stale hashes, each block hash is stored in the block hash table along with the following metadata: (i) the location of the block in the decompressor cache; (ii) forward and reverse pointers that allow traversing the hashes in the order in which the blocks were added to the cache (e.g., from oldest to newest and newest to oldest); and (iii) an oldest saved block hash pointer indicating the oldest block which has not been overwritten at the decompressor, which serves as the starting point of this doubly linked list. When a block is added to the decompressor cache, it overwrites a certain number of bytes of one or more older blocks. The compressor traverses the block hash linked list starting at the oldest block hash (pointed to by the oldest block hash pointer) until it reaches a block hash whose block is stored at the decompressor just beyond the overwritten last byte. All the block hashes traversed in this process are marked as stale, and the oldest saved block pointer is also updated to point to the first block just beyond the overwritten last byte.

With further reference to FIG. 6A, in cases where the Stage 1 block-level compression does not determine a match for an input data block 601, that data block is passed on for further compression processing by the Stage 2 and Stage 3 compressors. In accordance with example embodiments, the Stage 2 compressor comprises a byte-level long-range compression (LRC) compressor 614, along with an associated compressor byte cache 615 and byte string hash table 616. If an entire data block (as a whole) could not be compressed by the Stage 1, the data block 602 it is passed to the Stage 2 byte-level LRC compressor 614. At the second stage, the compressor attempts to compress the data on a sub-block level (e.g., a byte segment-level), by locating duplicate segments of data based on the byte-level cache 615, which stores a history of previously received data segments (e.g., a cache of tens or hundreds of megabytes of historical data)—but, unlike the block-level compressor, in this stage, the byte cache stores a copy of previously received data. The byte cache is configured as a circular buffer, which stores the data packets of the blocks input to the compressor from the first stage, wherein the packets are sequentially added to the byte cache, overwriting the oldest bytes in the cache.

By way of example, the byte-level LRC compressor 614 compresses each packet of the input data block with reference to the compressor byte cache 615. As compressed, each input packet is represented as a concatenation of a number of "match regions" and "literal regions." Each match region identifies a contiguous byte segment of the input packet that matches a contiguous byte segment in the decompressor cache. One or more literal regions may occur between match regions (or there may not be any literal regions), where literal regions occur, each literal region reflects a segment of the input packet for which a match was not found in the byte cache. As with the block-level compression, the byte-level compression is achieved by replacing each match segment by a "match descriptor," which specifies the location and the length of the matching byte segment in the decompressor cache. The byte-level compressor keeps track of the byte sequence and hence the location of the bytes as they will be stored in the decompressor cache 632, which enables the compressor to determine and provide the match descriptor information to the decompressor for locating the compressed segments within the decompressor cache. With respect to input data blocks, for which the block-level compressor compressed based on a block-level match, the block-level compressor provides an indicator to the byte-level compressor, which specifies the location and length of each such block relative to the uncompressed data blocks passed on to the byte-level compressor. The byte-level compressor will thereby be able to account for such compressed (removed) blocks in maintaining accurate tracking as to the location of the data segments stored in the decompressor cache 632. Regarding the literal regions, these regions are not compressed by the MS-LRC. Each resulting compressed MS-LRC packet thereby consists of a number of match descriptors and literal segments. After each input packet is compressed, the input packet (in its un-compressed format) is added to the compressor byte cache, overwriting the oldest data byte.

The byte-level LRC compressor 614 then passes the compressed data (represented as the concatenation of match regions and literal regions) 603 on to the Stage 3, SRC compressor 617, for further compression processing. For example, the third stage compression may comprise a GBC or V.44 compression algorithm. The main role of the third stage is to exploit any residual or micro redundancies in the literal segments in the output of the second stage. For example, the third stage may apply a more powerful algorithm than the first stage. In view of the fact that the second stage has already eliminated long range redundancies from the data provided to the third stage, the third stage can operate with a smaller history (hence there is less data to be processed), with no loss in performance. In particular, a short-range compressor retains a short or recent range of previously received bytes in an input byte stream for compression, and thus captures "micro redundancies" in the input byte stream. For example, while a long range compressor may store the last $10^9$ input bytes of data, and thus a current input data byte may be compared with all of the stored $10^9$ bytes for any similar bit sequences or redundancies (match regions), the short-range compressor uses a smaller amount of received bytes than the long range compressor to determine redundancies. This in turn permits the use of more powerful techniques than the first stage, and the combination of the two stages delivers near optimal compression gain.

Turning again to FIG. 6A, the staged compressor 610 includes the multiplexer (MUX) 619. The Stage 1 block-level LRC compressor 611 provides the block-level match descriptors 604 (e.g., index pointers and lengths identifying the location of entire match blocks stored within the decompressor cache 632) to the MUX 619. The Stage 2 byte-level LRC compressor 614 provides the byte-level match descriptors 605 (e.g., index pointers and lengths identifying the location of match segments stored within the decompressor cache 632) to the MUX 619. The Stage 3 SRC compressor 617 provides compressor codes 606 (e.g., grammar-based compressor codes) to the MUX 619. The multiplexer configures the data provided to it by the three compressor stages in a manner whereby the decompressor 630 can demultiplex the data, and feed the respective portions to the appropriate decompressor stages for reconstruction of the original uncompressed input data. The multiplexer then transmits the configure data 607 over the communications channel 621 to the decompressor 630.

With reference to FIG. 6B, the decompressor 630 includes the demultiplexer (DEMUX) 635. The demultiplexer receives the data 607 transmitted over the channel 621 by the staged compressor 610, and demultiplexes the received data into its constituent components. The demultiplexer provides the compressor codes 606 to the SRDC decompressor 633, and provides the byte-level match descriptors 605 and block-level match descriptors 604 to the byte-level LRDC decompressor 631. Based on the compressor codes, the SRDC decompressor reconstructs the decompressed literal byte sequences and passes them on to the byte-level LRDC decompressor 631. Based on the received byte-level match descriptors 605 and block-level match descriptors 604, the byte-level decompressor reconstructs the original uncompressed data blocks based on the matching data stored in the decompressor cache 632. More specifically, for the compressed byte-level matched segments, the decompressor is able to locate and retrieve these segments from the decompressor cache based on the index and length information maintained and provided by the byte-level compressor. Similarly, for the compressed block-level matched blocks, the decompressor is able to locate and retrieve these blocks from the decompressor cache based on the index and length information maintained and provided by the block-level compressor. The decompressor then stores the reconstructed data blocks in the decompressor cache 632, overwriting the oldest data within the cache. It should be noted that, at the decompressor, separate byte-level and block-level decompressors are not required, and all that is needed instead is a single byte-level long-range decompressor. This is facilitated based on the following: (i) the byte-level decompressor 631 maintains within its cache 632 all of the reconstructed input data in the order that such data was provided to the staged compressor 610; (ii) the block-level compressor 611 maintains a mapping of the location of each compressed block as stored in the decompressor cache, and is thus able to provide the necessary pointer information to the decompressor for reconstructing the compressed blocks from the decompressor cache; and (iii) the byte-level compressor 614 keeps track of the storage location of all compressed byte segments as stored in the decompressor cache (including accounting for the compressed blocks removed from the input data by the block-level compressor), and is thus able to provide the necessary pointer information to the decompressor for reconstructing the compressed byte segments from the decompressor cache. Accordingly, based on this architecture, the same decompressor cache 632 serves as the cache for reconstructing the compression performed by both the first and second compression stages of the compressor 610. In other words, data stored in the decompressed cache may provide for reproduction of entire blocks (in case of block duplication as detected by the first stage of compression) or reproduction of segments within blocks (as detected by the second stage of compression). This avoids duplicate storage of the data separately for the two stages and results in a more storage efficient architecture.

Further, in accordance with embodiments of the present invention, the Stage 2 and Stage 3 compression approaches and corresponding decompression approaches are described above in further detail with reference to FIGS. 1-5. Moreover, the byte stream comprising the internet traffic, which is to be compressed, is presented as a sequence of contiguous "blocks" to the compressor. The size of the blocks is variable and depends upon the layer at which compression is applied in the network stack. For example, at the IP layer, the blocks may be IP packets or at the application layer, blocks may be segments of HTTP objects or entire HTTP objects. The compressor carries out compression of the block and releases the compressed bytes for that block, without waiting for the future input blocks, which enables the compressor to maintain a "stream mode" of operation, which is a requirement for compression of Internet traffic. The same is also true for the operation of the decompressor.

Figure 7A:
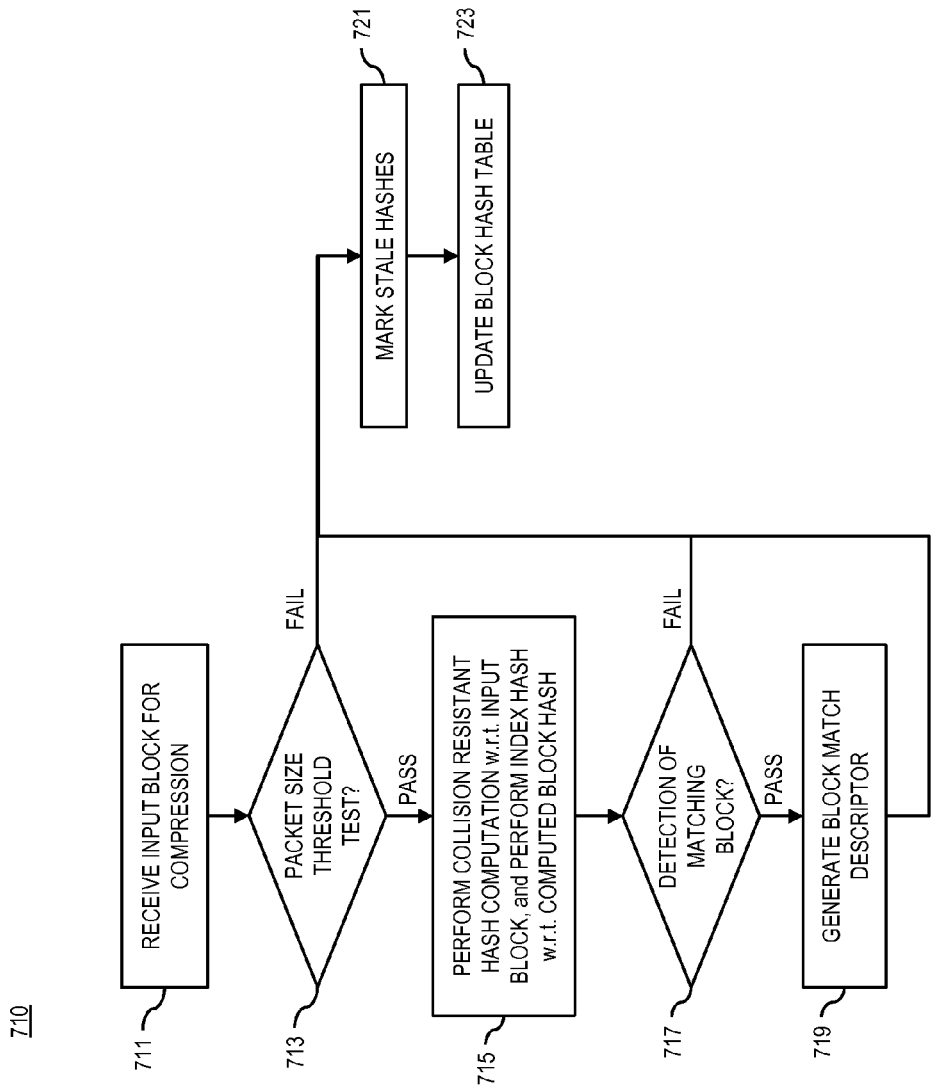
FIG. 7A illustrates a flow chart of a compression process for the Stage 1 block-level compressor of FIG. 6A, in accordance with example embodiments of the invention.

FIG. 7A illustrates a flow chart of a compression process 710 for the Stage 1 block-level compressor of FIG. 6A, in accordance with example embodiments of the invention. At Step 711, a new input block is received at the Stage 1 compressor for processing. At Step 713, a packet size threshold test is applied to determine if the packet size is above a predetermined threshold—this test is performed to ensure that the compression overhead associated with the first stage is not incurred for a small block that does not justify the overhead. If the packet size threshold test fails, then the Stage 1 block-level compression is bypassed, and the input data is passed on to the Stage 2 byte-level compressor. If the packet size threshold test passes, then the block-level compression process proceeds. At Step 715, the block-level compressor performs a collision-resistant hash computation (e.g., a 20-byte SHA-1) with respect to the input block to generate a block hash corresponding to the input block, and performs an index hash with respect to the block hash to generate an index to the block hash table. At Step 717, the block-level compressor performs a matching block determination by comparing the computed block hash against the block hash table, whereby the determination passes and a matching block is determined if an identical block hash value is stored in the block hash table that has not been marked as stale. At Step 719, if a match is detected, block-level compressor compresses the input block and determines a respective match descriptor—comprising the offset of the first byte of the matching block relative to the end of the cache (e.g., the index of the next byte to be written in the decompressor cache) and the length of the matching data block. The match descriptor fields may further be compressed by a variable length coding scheme for improved efficiency. At Step 721, the block-level compressor marks the stale block hashes based on the data that will be overwritten in the decompressor cache by the current input block. At Step 723, the block-level compressor updates the block hash table, whereby: (1) in the case of no block match, the block hash of the new input block is inserted into the block hash table at the location given by the index determined in Step 715, and metadata is initialized so that (a) it reflects the position of the new block in the decompressor cache and (b) it points to the previous block hash (used to mark stale block hashes); and (2) in the case of a block match, the block hash already exists in the block hash table, so it is only necessary to update the metadata so that it reflects the position of the new block in the decompressor cache (rather than pointing to the older duplicate occurrence).

Figure 7B:
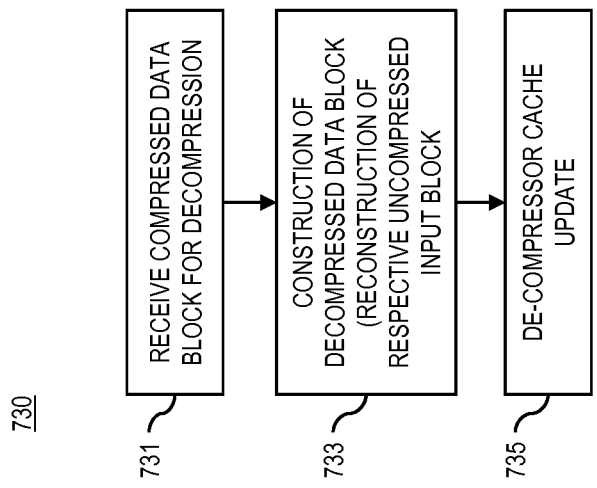
FIG. 7B illustrates a flow chart of a decompression process for the Stage 2 byte-level decompressor of FIG. 6B, in accordance with example embodiments of the invention.

FIG. 7B illustrates a flow chart of a decompression process 730 for the Stage 2 byte-level decompressor of FIG. 6B, in accordance with example embodiments of the invention. At Step 731, the byte-level LRDC decompressor 631 receives a compressed data block for decompression. At Step 733, the decompressor decompresses the compressed block (reconstructs the respective uncompressed input block) based on the data stored in the decompressor cache (as reflected by the respective byte-level and block-level match descriptors provided by the byte-level and block-level compressors, respectively) and based on the literal segments. At Step 735, the decompressor updates the decompressor cache 632. The decompressor adds the decompressed data block to the decompressor cache, overwriting the oldest bytes.

Figure 8:
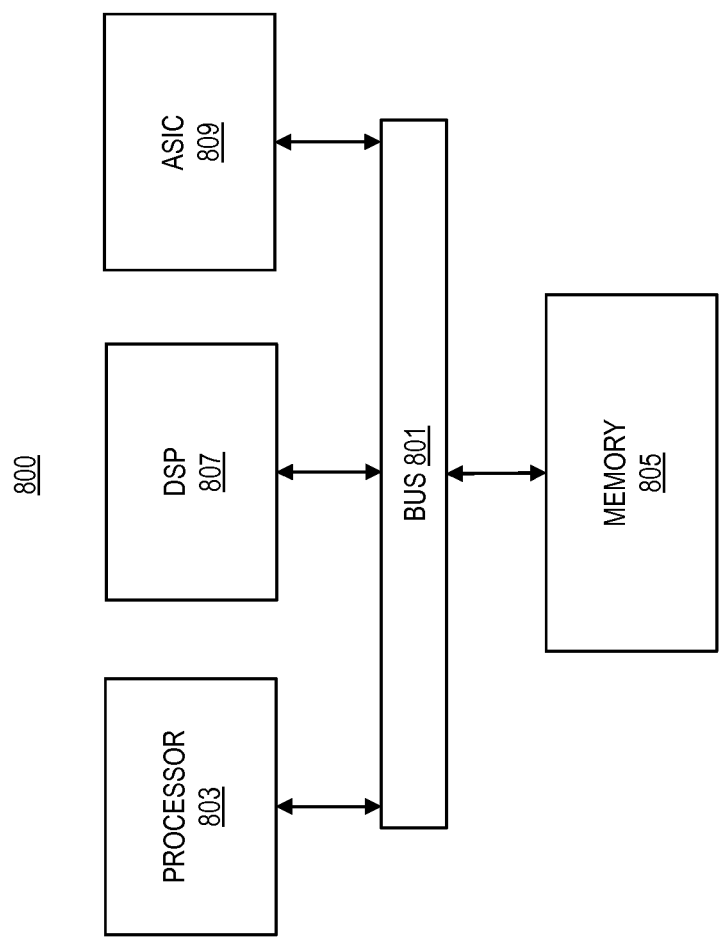
FIG. 8 illustrates a block diagram of a chip set that can be utilized in implementing example embodiments of the present invention.

FIG. 8 illustrates a block diagram of a chip set that can be utilized in implementing example embodiments of the present invention. With reference to FIG. 8, chip set 800 includes, for instance, processor and memory components described with respect to the foregoing example embodiments, and incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 800 includes a communication mechanism such as a bus 901 for passing information among the components of the chip set. A processor 803 has connectivity to the bus 801 to execute instructions and process information stored in, for example, a memory 805. The processor 803 includes one or more processing cores with each core configured to perform independently. A multi-core processor enables multiprocessing within a single physical package. Examples of a multi-core processor include two, four, eight, or greater numbers of processing cores. Alternatively or in addition, the processor 803 includes one or more microprocessors configured in tandem via the bus 801 to enable independent execution of instructions, pipelining, and multithreading. The processor 803 may also be accompanied with one or more specialized components to perform certain processing functions and tasks such as one or more digital signal processors (DSP) 807, and/or one or more application-specific integrated circuits (ASIC) 809. A DSP 807 typically is configured to process real-world signals (e.g., sound) in real time independently of the processor 803. Similarly, an ASIC 809 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 803 and accompanying components have connectivity to the memory 805 via the bus 801. The memory 805 may comprise various forms of computer-readable media, e.g., including both dynamic memory (e.g., RAM) and static memory (e.g., ROM) for storing executable instructions that, when executed by the processor 803 and/or the DSP 807 and/or the ASIC 809, perform the process of example embodiments as described herein. The memory 805 also stores the data associated with or generated by the execution of the process.

The term "computer-readable medium" or "computer-readable media," as used herein, refers to any medium that participates in providing instructions for execution by the processor 803, and/or one or more of the specialized components, such as the one or more digital signal processors (DSP) 807, and/or one or more application-specific integrated circuits (ASIC) 809. Such a medium may take many forms, including but not limited to non-volatile media, volatile media, and transmission media. Non-volatile media include, for example, read only memory (ROM), included within memory 805. Volatile media, for example, may include dynamic random access memory (RAM), included within memory 805. Transmission media may include copper or other conductive wiring, fiber optics, or other physical transmission media, including the wires and/or optical fiber that comprise bus 801. Transmission media can also take the form of wireless data signals, such as those generated during radio frequency (RF) and infrared (IR) data communications. Common forms of computer-readable media include, for example, magnetic storage media (e.g., magnetic hard disks or any other magnetic storage medium), solid state or semiconductor storage media (e.g., RAM, PROM, EPROM, FLASH EPROM, a data storage device that uses integrated circuit assemblies as memory to store data persistently, or any other storage memory chip or module), optical storage media (e.g., CD ROM, CDRW, DVD, or any other optical storage medium), a or any other medium for storing data from which a computer or processor can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Moreover, as will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention.

FIG. 9 illustrates a block diagram of a computer system that can be utilized in implementing example embodiments of the present invention. The computer system 900 includes a bus 901 or other communications mechanism for communicating information, and a processor 903 coupled to the bus 901 for processing information. The processor may comprise one or more of various types of general processors, and/or one or more specialized components (not shown), such as the one or more digital signal processors (DSPs) and/or one or more application-specific integrated circuits (ASICs). The computer system 900 also includes main memory 905, such as a random access memory (RAM) or other dynamic storage device, coupled to the bus 901 for storing information and instructions to be executed by the processor 903. Memory 905 can also be used for storing temporary variables or other intermediate information during execution of instructions to be executed by the processor 903. The computer system 900 further includes a read only memory (ROM) 907 or other static storage device coupled to the bus 901 for storing static information and instructions for the processor 903. A storage device 909, such as a magnetic disk or optical disk, is additionally coupled to the bus 901 for storing information and instructions.

The computer system 900 can be coupled via the bus 901 to a display 911, such as a cathode ray tube (CRT), liquid crystal display, active matrix display, or plasma display, for displaying information to a computer user. An input device 913, such as a keyboard including alphanumeric and other keys, is coupled to the bus 901 for communicating information and command selections to the processor 903. Another type of user input device is cursor control 915, such as a mouse, a trackball, or cursor direction keys for communicating direction information and command selections to the processor 903 and for controlling cursor movement on the display 911.

According to aspects of the invention, dynamic and flexible architectures, apparatus and methods for implementing load balancing for traffic loads for multiple priorities, in accordance with example embodiments, are provided by the computer system 900 in response to the processor 903 executing an arrangement of instructions contained in main memory 905. Such instructions can be read into main memory 905 from another computer-readable medium, such as the storage device 909. Execution of the arrangement of instructions contained in main memory 905 causes the processor 903 to perform the process steps described herein. One or more processors in a multi-processing arrangement can also be employed to execute the instructions contained in main memory 905. In alternative embodiments, hard-wired circuitry can be used in place of or in combination with software instructions to implement embodiments and aspects of the invention. Thus, embodiments of the present invention are not limited to any specific combination of hardware circuitry and software.

The computer system 900 also includes a communications interface 917 coupled to bus 901. The communications interface 917 provides a two-way data communications, such as coupling to a network link 919 connected to a local network 921 or to or from remote terminals or controllers of communications systems. For example, the communications interface 917 can be a digital subscriber line (DSL) card or modem, an integrated services digital network (ISDN) card, a cable modem, or a telephone modem to provide a data communications connection to a corresponding type of telephone line. As another example, communications interface 917 can be a local area network (LAN) card (e.g., for Ethernet or an Asynchronous Transfer Model (ATM) network) to provide a data communications connection to a compatible LAN. Wireless links, such as for satellite communications systems, can also be implemented. In any such implementation, communications interface 917 sends and receives electrical, electromagnetic, or optical signals that carry digital data streams representing various types of information. Further, the communications interface 917 can include peripheral interface devices, such as a Universal Serial Bus (USB) interface, a PCMCIA (Personal Computer Memory Card International Association) interface, etc.

The network link 919 typically provides data communications through one or more networks to other data devices. For example, the network link 919 can provide a connection through local network 921 to a host computer 923, which has connectivity to a network 925 (e.g., a wide area network (WAN) or the global packet data communications network now commonly referred to as the "Internet") or to data equipment operated by service provider. The local network 921 and network 925 both use electrical, electromagnetic, or optical signals to convey information and instructions. The signals through the various networks and the signals on network link 919 and through communications interface 917, which communicate digital data with computer system 900, are example forms of carrier waves bearing the information and instructions.

The computer system 900 can send messages and receive data, including program code, through the network(s), network link 919, and communications interface 917. In the Internet example, a server (not shown) can transmit requested code belonging to an application program for implementing an embodiment of the present invention through the network 925, local network 921 and communications interface 917. The processor 903 can execute the transmitted code while being received and/or store the code in storage device 909, or other non-volatile storage for later execution. In this manner, computer system 900 can obtain application code in the form of a carrier wave.

While example embodiments and aspects of the present invention may provide for various implementations (e.g., including hardware, firmware and/or software components), and, unless stated otherwise, all functions are performed by a CPU or a processor executing computer executable program code stored in a non-transitory memory or computer-readable storage medium, the various components can be implemented in different configurations of hardware, firmware, software, and/or a combination thereof. Except as otherwise disclosed herein, the various components shown in outline or in block form in the figures are individually well known and their internal construction and operation are not critical either to the making or using of this invention or to a description of the best mode thereof.

In the preceding specification, various embodiments have been described with reference to the accompanying drawings. It will, however, be evident that various modifications may be made thereto, and additional embodiments may be implemented, without departing from the broader scope of the invention, as set forth in the claims that follow. The specification and drawings are accordingly to be regarded in an illustrative rather than restrictive sense.

What is claimed is:

1. A method for staged data compression, comprising:
receiving, by a long-range block-level compressor of a device, a plurality of data blocks of an input data stream, generating a hash value corresponding to each data block, and storing the hash values in a block hash table;
determining whether the hash value for each data block matches any of the hash values stored in the block hash table, wherein each hash value stored in the table corresponds to a respective previously received one of the data blocks of the input stream;
when it is determined that the hash value for a one data block of the input data stream matches a one of the hash values stored in the block hash table, generating a block-level match descriptor, and removing the one data block from the input data stream;
when it is determined that the hash value for a further data block of the input data stream does not match any of the plurality of hash values stored in the block hash table,
(i) outputting the further data block,
(ii) receiving, by a long-range byte-level compressor of the device, the further data block, and performing a long-range byte-level compression function on the further data block, which includes determining one or more bit strings of the further data block that each matches a respective bit string of a previously received data block, generating a byte-level match descriptor for each such bit string of the further data block, replacing each such bit string of the further data block with the respective byte-level match descriptor, and outputting literal byte segments reflecting any uncompressed literal segments of the further data block, and
(iii) receiving, by a short-range compressor of the device, the uncompressed literal segments of the further data block, performing a short-range compression function on the literal segments, and generating resulting compressor codes; and
multiplexing the block-level match descriptor, the byte-level match descriptors and the compressor codes.

2. The method of claim 1, wherein the block-level match descriptor comprises a block-level match indicator, a location reference corresponding to a storage location within a decompressor data cache of a previously received one of the data blocks of the input data stream that matches the one data block, and a length value indicating the length of the matching data block.

3. The method of claim 1, wherein each byte-level match descriptor comprises a location reference corresponding to a storage location within a decompressor data cache of the bit string of the previously received data block that matches the respective bit string of the further data block, and a length value indicating the length of the matching bit string.

4. The method of claim 1, further comprising:
determining, with respect to each new data block of the input data stream, one or more older data blocks of the input data stream that will be overwritten by the new data block within a decompressor data cache; and
marking as stale the hash values within the block hash table corresponding to the data blocks that will be overwritten.

5. The method of claim 4, wherein each determined hash value is stored in the block hash table along with metadata providing a storage location within the decompressor data cache where the corresponding data block is stored and providing a pointer to the oldest data block within the decompressor data cache, and wherein the determination of the one or more older data blocks that will be overwritten comprises:
assessing the block hash table, based on the metadata, starting with the oldest hash value and continuing until reaching a hash value corresponding to a first data block that will not be overwritten in the decompressor data cache.

6. The method of claim 1, wherein the long-range byte-level compression function further includes, for each bit string of the further data block that matches a respective bit string of a previously received data block, determining whether the bit string has been output as or within a one of the previous literal byte segments, and, when it is determined that the bit string has been output as or within a one of the previous literal byte segments, skipping the byte-level compression of the bit string and outputting the bit string as a literal byte segment for compression via the short-range compression function.

7. The method of claim 6, wherein the determination of whether the bit string has been output as or within a one of the previous literal byte segments includes maintaining a list of descriptors respectively corresponding to previously output literal byte segments and determining whether the bit string is contained in the list of descriptors.

8. The method of claim 1, wherein the determination of the one or more bit strings of the further data block that each matches a respective bit string of a previously received data block comprises:
generating a fingerprint corresponding to each of the one or more bit strings of the further data block based on a sliding fingerprint window, and storing the finger prints in a byte hash table;
determining whether the fingerprint for each of one or more of the bit strings of the further data block matches any of the fingerprints stored in the byte has table, wherein each fingerprint stored in the table corresponds to a respective bit string of the previously received data blocks; and
when it is determined that the fingerprint for a one of the bit strings of the further data block matches a one of the fingerprints stored in the byte hash table, determining whether the one bit string matches the bit string corresponding to the matched fingerprint in the byte hash table, wherein the bit strings of the previously received data blocks are stored in a compressor byte cache.

9. The method of claim 8, wherein, when it is determined that the fingerprint for a one of the bit strings of the further data block matches a one of the fingerprints stored in the byte hash table, the determination of the one or more bit strings of the further data block that each matches a respective bit string of a previously received data block further comprises:
expanding the match determination by determining bit strings to the left and to the right of the one bit string of the further data block that match respective bit strings to the left and to the right of the bit string stored in the compressor byte cache that matches the one bit string of the further data block.

10. An apparatus for staged data compression, comprising:
a long-range block-level compressor configured to receive a plurality of data blocks of an input data stream, to generate a hash value corresponding to each data block, to store the hash values in a block hash table within a memory of the apparatus, and to determine whether the hash value for each data block matches any of the hash values stored in the block hash table, wherein each hash value stored in the table corresponds to a respective previously received one of the data blocks of the input stream; and
wherein, when it is determined that the hash value for a one data block of the input data stream matches a one of the hash values stored in the block hash table, the long-range block-level compressor is further configured to generate a block-level match descriptor and to remove the one data block from the input data stream, and
wherein, when it is determined that the hash value for a further data block of the input data stream does not match any of the plurality of hash values stored in the block hash table, the long-range block-level compressor is further configured to output the further data block; and
the apparatus further comprising a long-range byte-level compressor configured to receive the further data block and to perform a long-range byte-level compression function on the further data block, wherein the long-range byte-level compression function includes determining one or more bit strings of the further data block that each matches a respective bit string of a previously received data block, generating a byte-level match descriptor for each such bit string of the further data block, replacing each such bit string of the further data block with the respective byte-level match descriptor, and outputting literal byte segments reflecting any uncompressed literal segments of the further data block; and
the apparatus further comprising a short-range compressor configured to receive the uncompressed literal segments of the further data block, to perform a short-range compression function on the literal segments, and to generate resulting compressor codes; and
the apparatus further comprising a multiplexer configured to multiplex the block-level match descriptor, the byte-level match descriptors and the compressor codes.

11. The apparatus of claim 10, wherein the block-level match descriptor comprises a block-level match indicator, a location reference corresponding to a storage location within a decompressor data cache of a previously received one of the data blocks of the input data stream that matches the one data block, and a length value indicating the length of the matching data block.

12. The apparatus of claim 10, wherein each byte-level match descriptor comprises a location reference corresponding to a storage location within a decompressor data cache of the bit string of the previously received data block that matches the respective bit string of the further data block, and a length value indicating the length of the matching bit string.

13. The apparatus of claim 10, wherein the long-range block-level compressor is further configured to determine, with respect to each new data block of the input data stream, one or more older data blocks of the input data stream that will be overwritten by the new data block within a decompressor data cache, and to mark as stale the hash values within the block hash table corresponding to the data blocks that will be overwritten.

14. The apparatus of claim 13, wherein each determined hash value is stored in the block hash table along with metadata providing a storage location within the decompressor data cache where the corresponding data block is stored and providing a pointer to the oldest data block within the decompressor data cache, and wherein the determination of the one or more older data blocks that will be overwritten comprises:
assessing the block hash table, based on the metadata, starting with the oldest hash value and continuing until reaching a hash value corresponding to a first data block that will not be overwritten in the decompressor data cache.

15. The apparatus of claim 10, wherein the long-range byte-level compression function further includes, for each bit string of the further data block that matches a respective bit string of a previously received data block, determining whether the bit string has been output as or within a one of the previous literal byte segments, and, when it is determined that the bit string has been output as or within a one of the previous literal byte segments, skipping the byte-level compression of the bit string and outputting the bit string as a literal byte segment for compression via the short-range compression function.

16. The apparatus of claim 15, wherein the determination of whether the bit string has been output as or within a one of the previous literal byte segments includes maintaining a list of descriptors respectively corresponding to previously output literal byte segments and determining whether the bit string is contained in the list of descriptors.

17. The apparatus of claim 10, wherein the determination of the one or more bit strings of the further data block that each matches a respective bit string of a previously received data block comprises:
generating a fingerprint corresponding to each of the one or more bit strings of the further data block based on a sliding fingerprint window, and storing the finger prints in a byte hash table;
determining whether the fingerprint for each of one or more of the bit strings of the further data block matches any of the fingerprints stored in the byte has table, wherein each fingerprint stored in the table corresponds to a respective bit string of the previously received data blocks; and
when it is determined that the fingerprint for a one of the bit strings of the further data block matches a one of the fingerprints stored in the byte hash table, determining whether the one bit string matches the bit string corresponding to the matched fingerprint in the byte hash table, wherein the bit strings of the previously received data blocks are stored in a compressor byte cache.

18. The apparatus of claim 17, wherein, when it is determined that the fingerprint for a one of the bit strings of the further data block matches a one of the fingerprints stored in the byte hash table, the determination of the one or more bit strings of the further data block that each matches a respective bit string of a previously received data block further comprises:
expanding the match determination by determining bit strings to the left and to the right of the one bit string of the further data block that match respective bit strings to the left and to the right of the bit string stored in the compressor byte cache that matches the one bit string of the further data block.

* * * * *